US012672499B2

(12) United States Patent
Fujita et al.

(10) Patent No.: US 12,672,499 B2
(45) Date of Patent: Jun. 30, 2026

(54) SUBSTRATE PROCESSING METHOD AND SUBSTRATE PROCESSING APPARATUS

(71) Applicant: Tokyo Electron Limited, Tokyo (JP)

(72) Inventors: Akira Fujita, Koshi (JP); Kyosei Goto, Koshi (JP); Hiroki Aso, Koshi (JP); Daisuke Saiki, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/411,210

(22) Filed: Jan. 12, 2024

(65) Prior Publication Data

US 2024/0153756 A1 May 9, 2024

Related U.S. Application Data

(62) Division of application No. 17/644,843, filed on Dec. 17, 2021, now Pat. No. 11,908,680.

(30) Foreign Application Priority Data

Dec. 18, 2020    (JP) ................................. 2020-209951
Sep. 8, 2021    (JP) ................................. 2021-145972
Oct. 27, 2021    (JP) ................................. 2021-175600

(51) Int. Cl.
    *H01L 21/02*       (2006.01)
    *H01L 21/3213*     (2006.01)
    *H01L 21/67*       (2006.01)
(52) U.S. Cl.
    CPC .. *H01L 21/02068* (2013.01); *H01L 21/32134* (2013.01); *H01L 21/67051* (2013.01)
(58) Field of Classification Search
    CPC ......... H01L 21/02068; H01L 21/32134; H01L 21/67051; H01L 21/67103;

(Continued)

(56) References Cited

U.S. PATENT DOCUMENTS 6,096,233 A * 8/2000 Taniyama ............... H01L 22/26
                                   438/748
6,309,981 B1 10/2001 Mayer et al.

(Continued)

FOREIGN PATENT DOCUMENTS

JP      2002184751 A * 6/2002
JP      2003-086567 A    3/2003

(Continued)

OTHER PUBLICATIONS

JP-2002184751-A, Machine Translation (Year: 2024).*

*Primary Examiner* — Joshua L Allen
*Assistant Examiner* — Christopher Remavege
(74) *Attorney, Agent, or Firm* — Chrisman Gallo Tochtrop LLC

(57) ABSTRACT

A substrate processing method includes a first process of supplying an etching liquid to a peripheral portion of a substrate while rotating the substrate having a metal polycrystalline film formed on a front surface thereof; a second process of supplying a rinse liquid to a portion of the substrate closer to a center side of the substrate than a supply position of the etching liquid in the first process while rotating the substrate; a third process of supplying the etching liquid to the peripheral portion of the substrate while rotating the substrate; a fourth process of supplying the rinse liquid to a portion of the substrate closer to the center side of the substrate than a supply position of the etching liquid in the third process while rotating the substrate; and a fifth process of drying the substrate after the fourth process.

2 Claims, 29 Drawing Sheets

(58) Field of Classification Search
    CPC ......... H01L 21/67109; H01L 21/67028; H01L
                21/6708; H01L 21/67253; H01L
                21/67034; H01L 21/6838; H01L
                21/68792; H01L 21/02071; H01L
                21/67023
    See application file for complete search history.

(56) References Cited

U.S. PATENT DOCUMENTS

| | | | |
|---|---|---|---|
| 6,983,755 B2 | 1/2006 | Nam et al. | |
| 7,364,626 B2 * | 4/2008 | Hirose ...................... B08B 3/04 | |
| | | | 134/144 |
| 7,439,190 B2 * | 10/2008 | Tanaka .............. H01L 21/31111 | |
| | | | 438/692 |
| 7,780,867 B1 | 8/2010 | Mayer et al. | |
| 9,385,012 B2 * | 7/2016 | Fujii ................... H01L 21/6715 | |
| 10,490,424 B2 | 11/2019 | Nanba | |
| 10,651,029 B2 | 5/2020 | Takahashi et al. | |
| 11,062,899 B2 | 7/2021 | Hasimoto et al. | |
| 11,062,904 B2 | 7/2021 | Motoyama et al. | |
| 2003/0098040 A1 | 5/2003 | Nam et al. | |

| | | | |
|---|---|---|---|
| 2009/0186488 A1 | 7/2009 | Takeo et al. | |
| 2011/0062114 A1 | 3/2011 | Mizuno et al. | |
| 2013/0206726 A1 | 8/2013 | Oono | |
| 2014/0051259 A1 | 2/2014 | Shibayama | |
| 2014/0197129 A1 | 7/2014 | Fujii | |
| 2014/0352737 A1 * | 12/2014 | Ookouchi ......... H01L 21/67051 | |
| | | | 134/30 |
| 2015/0001087 A1 | 1/2015 | Dinneen et al. | |
| 2015/0151311 A1 * | 6/2015 | Jung ...................... B05D 1/005 | |
| | | | 118/52 |
| 2017/0038688 A1 * | 2/2017 | Nonaka ............. H01L 21/67017 | |
| 2018/0254199 A1 * | 9/2018 | Suzuki ............. H01L 21/30604 | |
| 2019/0057890 A1 | 2/2019 | Sato | |
| 2019/0067041 A1 | 2/2019 | Fujita | |

FOREIGN PATENT DOCUMENTS

| | | | |
|---|---|---|---|
| JP | 3990127 B2 | 10/2007 | |
| JP | 2011-211094 A | 10/2011 | |
| JP | 2014-038949 A | 2/2014 | |
| JP | 2019-040958 A | 3/2019 | |
| KR | 10-2011-0109850 A | 10/2011 | |
| KR | 10-2014-0023212 A | 2/2014 | |

* cited by examiner

Figure 6:
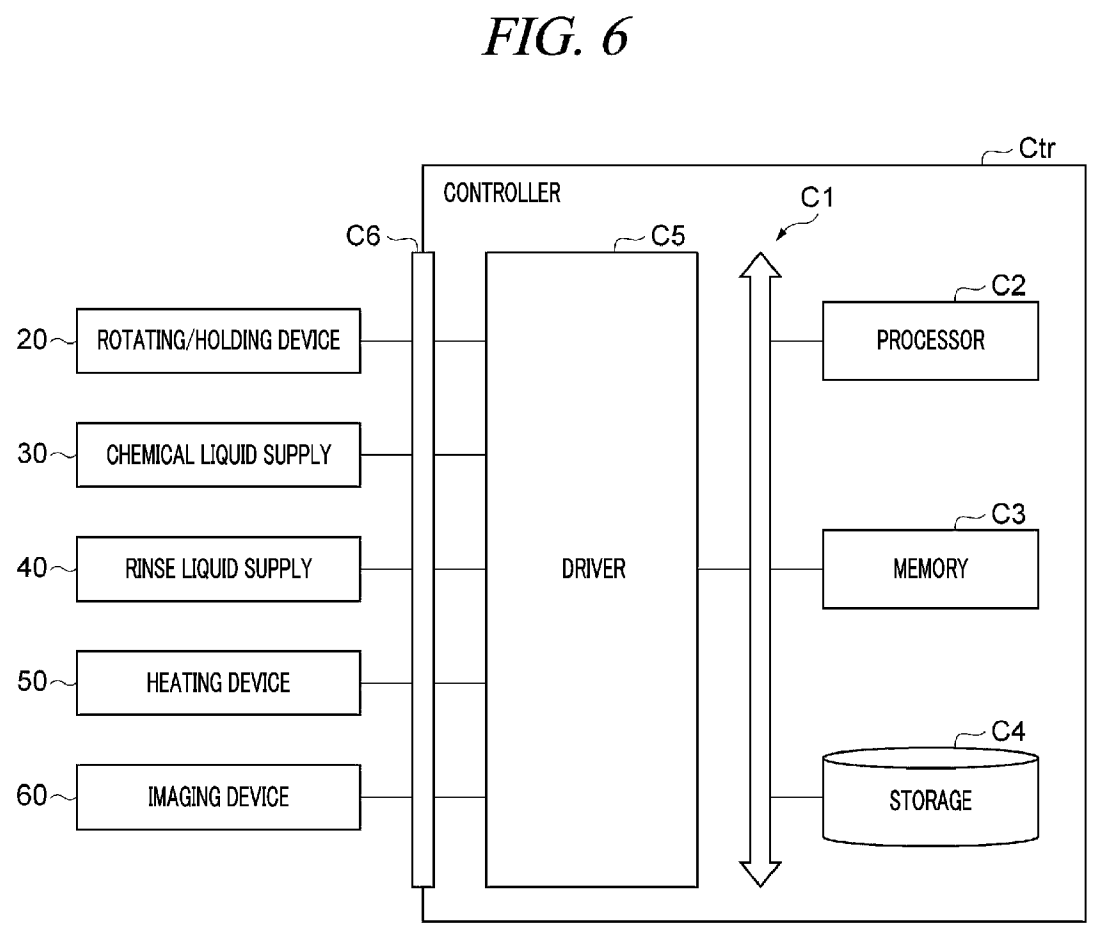

Ctr

CONTROLLER

C1

C2 PROCESSOR

C3 MEMORY

C4 STORAGE

C5 DRIVER

C6

20 ROTATING/HOLDING DEVICE

30 CHEMICAL LIQUID SUPPLY

40 RINSE LIQUID SUPPLY

50 HEATING DEVICE

60 IMAGING DEVICE

SUBSTRATE PROCESSING METHOD AND SUBSTRATE PROCESSING APPARATUS

CROSS-REFERENCE TO RELATED APPLICATION

This is a divisional application of U.S. patent application Ser. No. 17/644,843 filed on Dec. 17, 2021, which claims the benefit of Japanese Patent Application Nos. 2020-209951, 2021-145972 and 2021-175600 filed on Dec. 18, 2020, Sep. 8, 2021 and Oct. 27, 2021, respectively, the entire disclosures of which are incorporated herein by reference.

TECHNICAL FIELD

The various aspects and embodiments described herein pertain generally to a substrate processing method and a substrate processing apparatus.

BACKGROUND

Patent Document 1 discloses a substrate processing method of supplying, for a natural oxide film formed on a surface of a substrate, a chemical liquid such as hydrofluoric acid to a portion of the natural oxide film located at a peripheral portion of the substrate, and removing the corresponding natural oxide film by etching.

Patent Document 1: Japanese Patent Laid-open Publication No. 2019-040958

SUMMARY

In one exemplary embodiment, a substrate processing method includes partially etching a metal polycrystalline film at a peripheral portion of a substrate in a thickness direction by supplying an etching liquid to the peripheral portion while rotating the substrate having the metal polycrystalline film formed on a front surface thereof; washing away an etching residue generated in the partially etching of the metal polycrystalline film with a rinse liquid by supplying the rinse liquid to a portion of the substrate closer to a center side of the substrate than a supply position of the etching liquid in the partially etching of the metal polycrystalline film while rotating the substrate; etching a remaining portion of the metal polycrystalline film at the peripheral portion of the substrate by supplying the etching liquid to the peripheral portion while rotating the substrate; washing away an etching residue generated in the etching of the remaining portion of the metal polycrystalline film with the rinse liquid by supplying the rinse liquid to a portion of the substrate closer to the center side of the substrate than a supply position of the etching liquid in the etching of the remaining portion of the metal polycrystalline film while rotating the substrate; and drying the substrate after the washing away of the etching residue generated in the etching of the remaining portion of the metal polycrystalline film.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 1 is a plan view schematically illustrating an example of a substrate processing system;

FIG. 3 is a side view schematically illustrating an example of a processing unit;

FIG. 5 is a block diagram illustrating an example of main components of the substrate processing system;

FIG. 6 is a schematic diagram illustrating an example of a hardware configuration of a controller;

DETAILED DESCRIPTION

Figure 2:
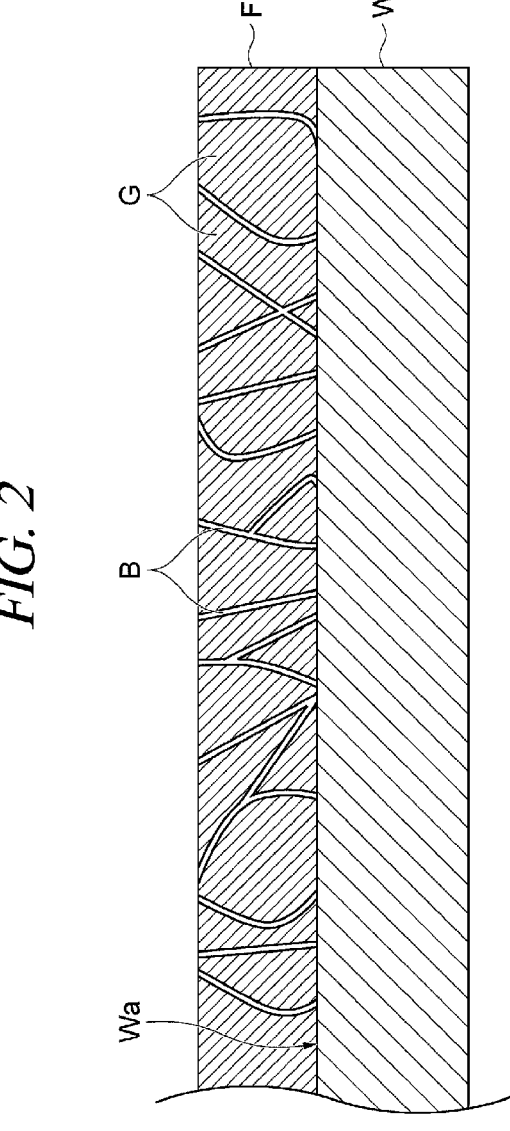
FIG. 2 is a cross sectional view schematically illustrating an example of a substrate and a metal polycrystalline film.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In the following description, same parts or parts having same functions will be assigned same reference numerals, and redundant description thereof will be omitted. Further, in the present specification, when referring to the top, bottom, right, and left of the drawing, the direction of the notation in the drawing is taken as a reference.

[Substrate Processing System]

Figure 1:
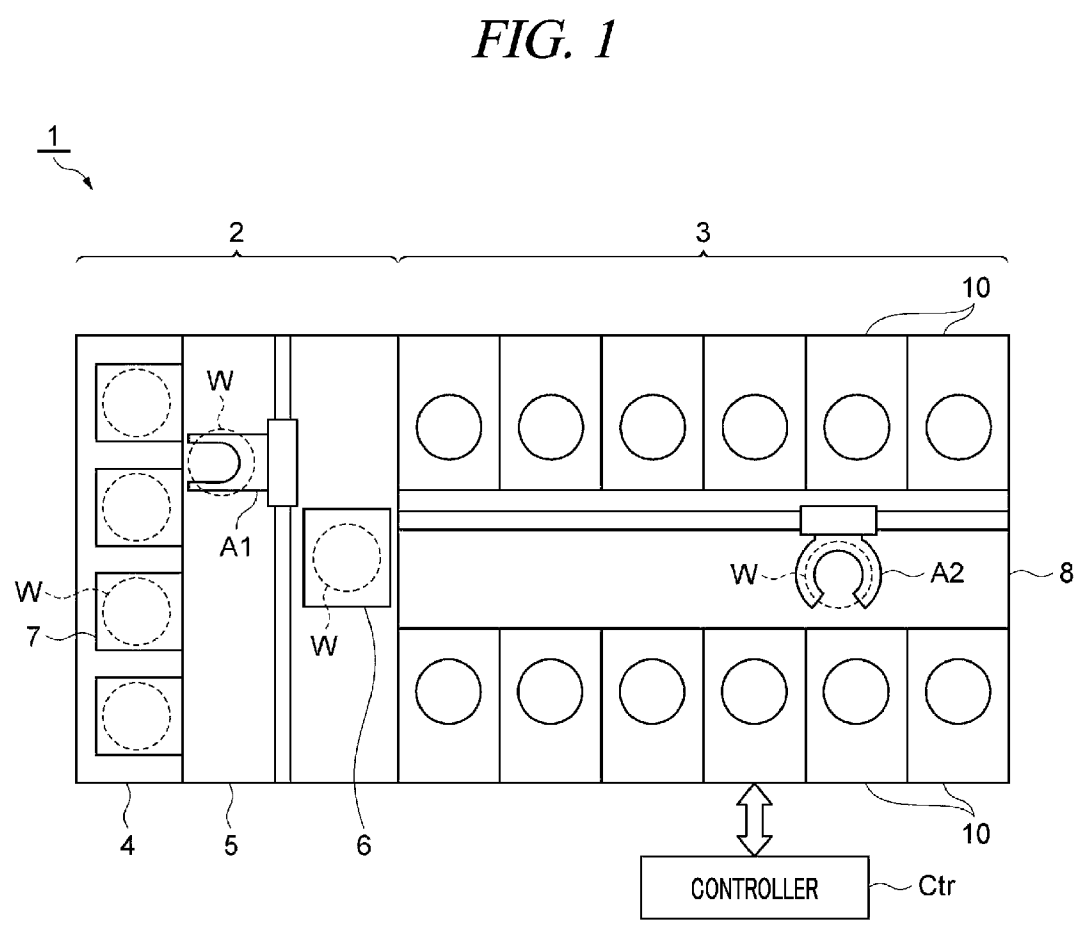

First, referring to FIG. 1, a substrate processing system 1 (substrate processing apparatus) configured to process a substrate W will be explained. The substrate processing system 1 includes a carry-in/out station 2, a processing station 3, and a controller Ctr (control unit). The carry-in/out station 2 and the processing station 3 may be arranged side by side in, for example, a horizontal direction.

The substrate W may be of a circular plate shape, or may be of a plate shape such as a polygon other than a circle. The substrate W may have a groove portion which is partially cut out. The groove portion may be, for example, a notch (a U-shaped or V-shaped groove) or a linear portion (so-called orientation flat) extending linearly. The substrate W may be, by way of non-limiting example, a semiconductor substrate (silicon wafer), a glass substrate, a mask substrate, a flat panel display (FPD) substrate, or any of various other kinds of substrates. The substrate W may have a diameter of, e.g., about 200 mm to 450 mm.

As depicted in FIG. 2, a metal polycrystalline film F is formed on a front surface Wa of the substrate W. The metal polycrystalline film F is composed of polycrystals in which a large number of metal crystal grains G are aggregated. The metal may be, for example, titanium nitride, titanium oxide, titanium, tungsten, tantalum, tantalum nitride, aluminum, aluminum oxide, copper, ruthenium, zirconium oxide, hafnium oxide, or the like. An interface between these crystal grains G is called a crystal grain boundary B, which is a discontinuous surface where the directions of the crystal grains G are different.

Referring back to FIG. 1, the carry-in/out station 2 includes a placing section 4, a carry-in/out section 5, and a shelf unit 6. The placing section 4 includes a plurality of placing tables (not shown) arranged in a width direction (up-and-down direction in FIG. 1). Each placing table is configured to place a carrier 7 (receptacle) thereon. The carrier 7 is configured to accommodate at least one substrate W in a sealed state. The carrier 7 includes an opening/closing door (not shown) through which the substrate W is carried in or out.

The carry-in/out section 5 is disposed adjacent to the placing section 4 in the direction in which the carry-in/out station 2 and the processing station 3 are arranged (left-and-right direction of FIG. 1). The carry-in/out section 5 includes an opening/closing door (not shown) provided to correspond to the placing section 4. If the opening/closing door of the carrier 7 and the opening/closing door of the carry-in/out section 5 are both opened in the state that the carrier 7 is placed on the placing section 4, the inside of the carry-in/out section 5 and the inside of the carrier 7 communicate with each other.

The carry-in/out section 5 incorporates therein a transfer arm A1 and the shelf unit 6. The transfer arm A1 is configured to be movable horizontally in the width direction (up-and-down direction of FIG. 1), movable up and down in a vertical direction, and pivotable about a vertical axis. The transfer arm A1 serves to take out the substrate W from the carrier 7 and hand it over to the shelf unit 6, and also serves to receive the substrate W from the shelf unit 6 and return it back into the carrier 7. The shelf unit 6 is located near the processing station 3, and is configured as a transit area for the transfer of the substrate W between the carry-in/out section 5 and the processing station 3.

The processing station 3 includes a transfer section 8 and a plurality of processing units 10. For example, the transfer section 8 extends horizontally in the direction (left-and-right direction of FIG. 1) in which the carry-in/out station 2 and the processing station 3 are arranged. The transfer section 8 incorporates a transfer arm A2 therein. The transfer arm A2 is configured to be movable horizontally in a lengthwise direction (left-and-right direction in FIG. 1) of the transfer section 8, movable up and down in the vertical direction, and pivotable about a vertical axis. The transfer arm A2 serves to take out the substrate W from the shelf unit 6 and pass it over to the corresponding processing unit 10, and also serves to receive the substrate W from the processing unit 10 and return it back into the shelf unit 6.

The plurality of processing units 10 are arranged side by side along the lengthwise direction (left-and-right direction in FIG. 1) of the transfer section 8 at both sides of the transfer section 8. The processing units 10 are configured to perform predetermined processings (for example, an etching processing of the metal polycrystalline film F, a cleaning processing of the substrate W, and so forth) on the substrate W. Details of the processing unit 10 will be described later.

The controller Ctr is configured to control the substrate processing system 1 partially or in overall. Details of the controller Ctr will be described later.

[Processing Unit]

Figure 3:
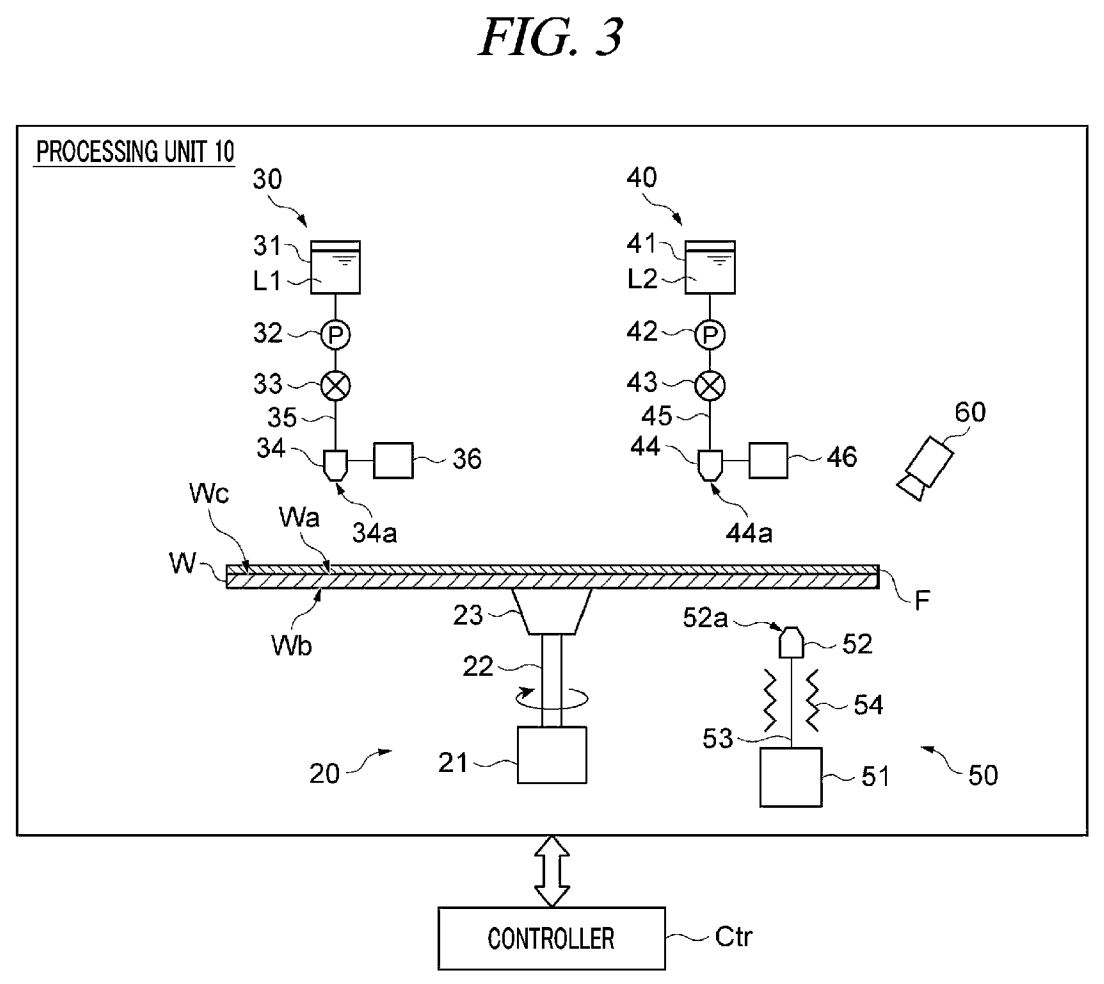
Figure 4:
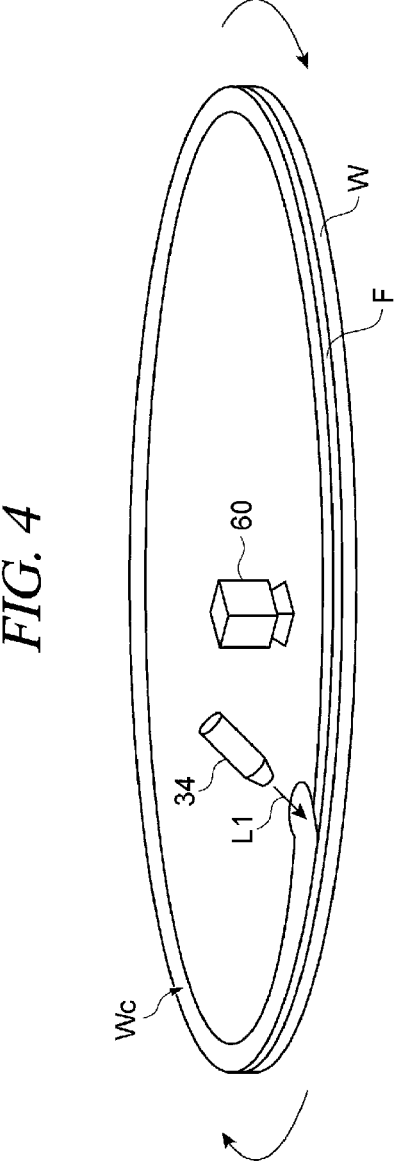
FIG. 4 is a perspective view illustrating a part of the processing unit of FIG. 3.

Now, referring to FIG. 3 and FIG. 4, the processing unit 10 will be elaborated. The processing unit 10 includes a rotating/holding device 20, a chemical liquid supply 30, a rinse liquid supply 40, a heating device 50, and an imaging device 60.

The rotating/holding device 20 includes a rotator 21, a shaft 22, and a holder 23. The rotator 21 is operated based on an operation signal from the controller Ctr, and configured to rotate the shaft 22. The rotator 21 may be a power source such as, but not limited to, an electric motor.

The holder 23 is provided at a leading end of the shaft 22. The holder 23 is configured to attract and hold a rear surface Wb of the substrate W by, for example, attraction. That is, the rotating/holding device 20 may be configured to rotate the substrate W around a central axis (rotation axis) perpendicular to the front surface Wa of the substrate W while keeping the substrate W in an approximately horizontal posture. As illustrated in FIG. 3 or the like, the rotating/holding device 20 may rotate the substrate W in a clockwise direction when viewed from above. Further, the holder 23 may be configured to attract and hold the entire rear surface Wb of the substrate W. In this case, even if the substrate W is bent or the like, the posture of the substrate W is corrected so that the substrate W is substantially horizontal.

The chemical liquid supply 30 is configured to supply an etching liquid L1 onto the substrate W. The etching liquid L1 includes, for example, an alkaline or acidic chemical liquid for removing the metal polycrystalline film F on the front surface Wa of the substrate W. The alkaline chemical liquid includes, for example, a SC-1 solution (a mixture of ammonia, hydrogen peroxide and pure water) or the like. The acidic chemical liquid includes, for example, a SC-2 solution (a mixture of hydrochloric acid, aqueous hydrogen peroxide and pure water), SPM (a mixture of sulfuric acid and aqueous hydrogen peroxide), a $HF/HNO_3$ solution (a mixture of hydrofluoric acid and nitric acid), or the like.

The chemical liquid supply 30 includes a liquid source 31, a pump 32, a valve 33, a nozzle 34, a pipeline 35, and a driving mechanism 36. The liquid source 31 is a source of the etching liquid L1. The pump 32 is operated based on an operation signal from the controller Ctr, and sends the etching liquid L1 sucked from the liquid source 31 to the nozzle 34 through the pipeline 35 and the valve 33.

The valve 33 is operated based on an operation signal from the controller Ctr, and is configured to switch between an open state in which a flow of a fluid in the pipeline 35 is allowed and a closed state in which the flow of the fluid in the pipeline 35 is blocked. The nozzle 34 is disposed above the substrate W so that a discharge opening 34a thereof faces the front surface Wa of the substrate W. The nozzle 34 is configured to discharge the etching liquid L1 sent from the pump 32 toward a peripheral portion Wc of the substrate W from the discharge opening 34a, as illustrated in FIG. 4.

Since the substrate W is being rotated by the rotating/holding device 20, the etching liquid L1 discharged to the peripheral portion Wc is diffused to the peripheral portion Wc over the entire circumference of the substrate W to be scattered outwards from the edge of the substrate W. For this reason, near a liquid landing point of the etching liquid L1 on the substrate W, the width of the etching liquid L1 in a diametrical direction of the substrate W is relatively large. On the downstream side of the etching liquid L1, on the other hand, the width of the etching liquid L1 in the diametrical direction of the substrate W becomes relatively small.

Referring back to FIG. 3, the pipeline 35 connects the liquid source 31, the pump 32, the valve 33 and the nozzle 34 in order from the upstream side. The driving mechanism 36 is directly or indirectly connected to the nozzle 34. The driving mechanism 36 is operated based on an operation signal from the controller Ctr, and is configured to move the nozzle 34 in the horizontal direction and the vertical direction above the substrate W.

The rinse liquid supply 40 is configured to supply a rinse liquid L2 to the substrate W. The rinse liquid L2 is, for example, a liquid for removing (washing away) the etching liquid L1 supplied onto the front surface Wa of the substrate W, a dissolved component of the metal polycrystalline film F by the etching liquid L1, an etching residue RE to be described later, and the like from the substrate W. The rinse liquid L2 includes, for example, deionized water (DIW), ozone water, carbonated water ($CO_2$ water), ammonia water, or the like.

The rinse liquid supply 40 includes a liquid source 41, a pump 42, a valve 43, a nozzle 44, a pipeline 45, and a driving mechanism 46. The liquid source 41 is a source of the rinse liquid L2. The pump 42 is operated based on an operation signal from the controller Ctr, and is configured to send the rinse liquid L2 sucked from the liquid source 41 to the nozzle 44 through the pipeline 45 and the valve 43.

The valve 43 is operated based on an operation signal from the controller Ctr, and is configured to switch between an open state in which a flow of a fluid in the pipeline 45 is allowed and a closed state in which the flow of the fluid in the pipeline 45 is blocked. The nozzle 44 is disposed above the substrate W so that a discharge opening 44a faces the front surface Wa of the substrate W. Like the nozzle 34, the nozzle 44 is configured to discharge the rinse liquid L2 sent from the pump 42 toward the peripheral portion Wc of the substrate W from the discharge opening 44a. In order to wash away the etching liquid L1 and the like on the substrate W with the rinse liquid L2, a liquid landing point of the rinse liquid L2 on the substrate W is set to be closer to the center of the substrate W than the liquid landing point of the etching liquid L1 on the substrate W is.

Since the substrate W is being rotated by the rotating/holding device 20, the rinse liquid L2 discharged to the peripheral portion Wc is diffused to the peripheral portion Wc over the entire circumference of the substrate W and scattered outwards from the edge of the substrate W, the same as the etching liquid L1. For this reason, near the liquid landing point of the rinse liquid L2 on the substrate W, the width of the rinse liquid L2 in the diametrical direction of the substrate W is relatively large. On the downstream side of the rinse liquid L2, on the other hand, the width of the rinse liquid L2 in the diametrical direction of the substrate W becomes relatively small.

The pipeline 45 connects the liquid source 41, the pump 42, the valve 43, and the nozzle 44 in order from the upstream side. The driving mechanism 46 is directly or indirectly connected to the nozzle 44. The driving mechanism 46 is operated based on an operation signal from the controller Ctr, and is configured to move the nozzle 44 in the horizontal direction and the vertical direction above the substrate W.

The heating device 50 is operated based on an operation signal from the controller Ctr, and is configured to heat the substrate W. The heating device 50 includes a gas source 51, a nozzle 52, a pipeline 53, and a heating source 54. The gas source 51 is a source of an inert gas such as nitrogen.

The nozzle 52 is disposed below the substrate W so that a discharge opening 52a thereof faces the rear surface Wb of the substrate W. The nozzle 52 is configured to discharge the inert gas from the gas source 51 toward the rear surface Wb of the substrate W. The pipeline 53 connects the gas source 51 and the nozzle 52.

The heating source 54 is, by way of example, a resistance heater or the like, and is configured to heat the inert gas flowing in the pipeline 53. For this reason, the heated inert gas is supplied to the rear surface Wb of the substrate W. Accordingly, the substrate W is heated to a preset temperature (e.g., about 50° C. to about 80° C.). Therefore, the etching processing of the metal polycrystalline film F by the etching liquid L1 supplied to substrate W is accelerated.

The imaging device 60 is disposed above the peripheral portion Wc of the substrate W, as illustrated in FIG. 3 and FIG. 4. The imaging device 60 is operated based on an operation signal from the controller Ctr, and is configured to image a part of the peripheral portion Wc of the substrate W. The imaging device 60 is also configured to transmit the captured image to the controller Ctr. The imaging device 60 may be, by way of non-limiting example, a CCD camera, a COMS camera, or the like. An installation place of the imaging device 60 is not particularly limited as long as it is provided inside the processing unit 10.

The imaging device 60 may be configured to image the peripheral portion Wc of the substrate W on the downstream side of the etching liquid L1, as illustrated in FIG. 4. This is because the etching residue RE is more likely to be left on the substrate W on the downstream side of the etching liquid L1, and the contrast of the etching residue RE is easily recognized by image processing.

[Details of Controller]

Figure 5:
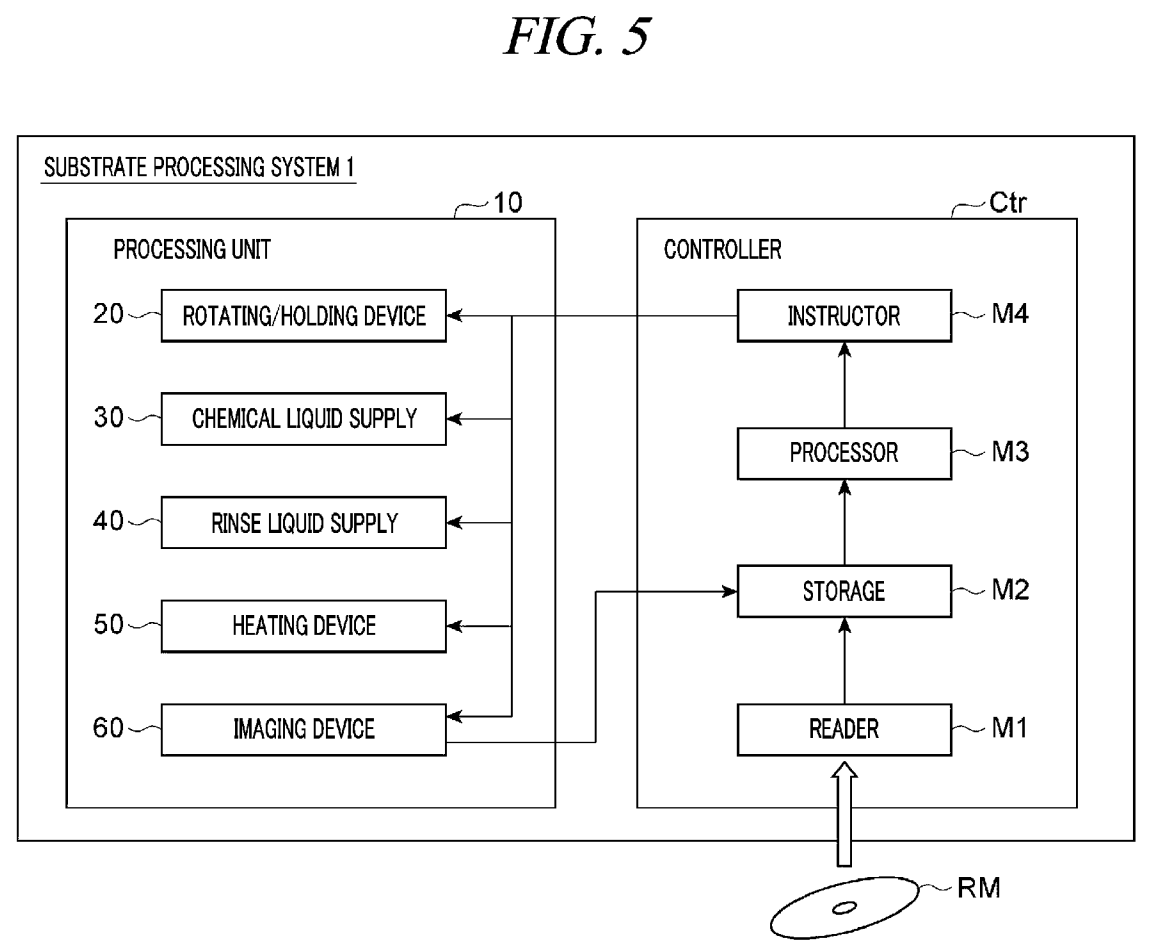

As shown in FIG. 5, the controller Ctr has, as functional modules, a reader M1, a storage M2, a processor M3, and an instructor M4. These functional modules are merely a division of functions of the controller Ctr into a plurality of modules for the sake of convenience, and do not necessarily mean that the hardware constituting the controller Ctr is divided into these modules. Each functional module is not limited to being realized by the execution of a program, and may be realized by a dedicated electric circuit (for example, a logic circuit) or an integrated circuit (ASIC: Application Specific Integrated Circuit) integrating the same.

The reader M1 is configured to read a program from a computer-readable recording medium RM. The recording medium RM stores therein a program for operating the individual components of the substrate processing system 1 including the processing unit 10. The recording medium RM may be, for example, a semiconductor memory, an optical recording disk, a magnetic recording disk, or a magneto-optical recording disk. In the following, each component of the substrate processing system 1 may include the rotating/holding device 20, the chemical liquid supply 30, the rinse liquid supply 40, the heating device 50, and the imaging device 60.

The storage M2 is configured to store various kinds of data therein. The storage M2 may store therein, for example, the program read out from the recording medium RM in the reader M1, setting data inputted by an operator through an external input device (not shown), and so forth. Further, the storage M2 may store therein data on the images captured by the imaging device 60. Also, the storage M2 may store therein processing conditions for the processing of the substrate W, or the like.

The processor M3 is configured to process various kinds of data. The processor M3 may generate, for example, a signal for operating each component of the substrate processing system 1 based on various kinds of data stored in the storage M2.

The instructor M4 is configured to transmit the operation signal generated by the processor M3 to each component of the substrate processing system 1.

The hardware of the controller Ctr may be composed of, for example, one or more control computers. The controller Ctr may include a circuit C1 as a hardware configuration, as shown in FIG. 6. The circuit C1 may be composed of an electric circuitry. The circuit C1 may include a processor C2, a memory C3, a storage C4, a driver C5, and an input/output port C6.

The processor C2 may be configured to realize each of the above-described functional modules by executing a program in cooperation with at least one of the memory C3 or the storage C4 and performing an input/output of a signal through the input/output port C6. The memory C3 and the storage C4 may function as the storage M2. The driver C5 may be a circuit configured to drive the respective components of the substrate processing system 1 individually. The input/output port C6 may be configured to mediate an input/output of signals between the driver C5 and each component of the substrate processing system 1.

The substrate processing system 1 may be equipped with one controller Ctr, or may be equipped with a controller group (control unit) including a plurality of controllers Ctr. When the substrate processing system 1 has the controller group, each of the above-described functional modules may be implemented by one controller Ctr, or may be implemented by a combination of two or more controllers Ctr. When the controller Ctr includes a plurality of computers (circuits C1), each of the above-described functional modules may be implemented by one computer (circuit C1), or by a combination of two or more computers (circuits C1). The controller Ctr may have a plurality of processors C2. In this case, each of the above-described functional modules may be implemented by one processor C2, or may be implemented by a combination of two or more processors C2.

[Substrate Processing Method]

Now, referring to FIG. 7 to FIG. 11, a method of etching the metal polycrystalline film F formed on the substrate W will be explained. Before the method is begun, the carrier 7 is previously placed on the placing table of the placing section 4. At least one substrate W having the metal polycrystalline film F formed on the front surface Wa thereof is accommodated in the carrier 7.

First, the controller Ctr controls the transfer arms A1 and A2 to take out one substrate W from the carrier 7 and transfer it into one of the processing units 10. The substrate W transferred into the processing unit 10 is placed on the holder 23.

Then, the controller Ctr controls the rotating/holding device 20 to attract and hold the rear surface of the substrate W with the holder 23 and, also, to rotate the substrate W. In this state, the controller Ctr controls the chemical liquid supply 30 to supply the etching liquid L1 from the nozzle 34 onto the peripheral portion Wc of the substrate W for a predetermined time (process S11 of FIG. 7 and FIG. 8A). For example, as shown in FIG. 8A, the driving mechanism 36 may move the nozzle 34 from the outside of the substrate W to a center side of the substrate W beyond the edge of the substrate W in the state that the etching liquid L1 is being discharged from the nozzle 34. Upon the lapse of the predetermined time, the driving mechanism 36 may move the nozzle 34 to the outside of the substrate W from the center side of the substrate W beyond the edge of the substrate W in the state that the etching liquid L1 is still being discharged from the nozzle 34.

The etching liquid L1 supplied onto a certain point of the peripheral portion Wc is diffused to the whole peripheral portion Wc along the entire circumference of the substrate W by the rotation of the substrate W, and is scattered outwards from the edge of the substrate W. For this reason, while the supply of the etching liquid L1 from the nozzle 34 is being carried on, a liquid film of the etching liquid L1 is formed on the peripheral portion Wc. As a result, a portion of the metal polycrystalline film F located at the peripheral portion Wc is etched. In the process S11, the metal polycrystalline film F is partially etched in a thickness direction thereof by the etching liquid 1_1.

Figure 9A:
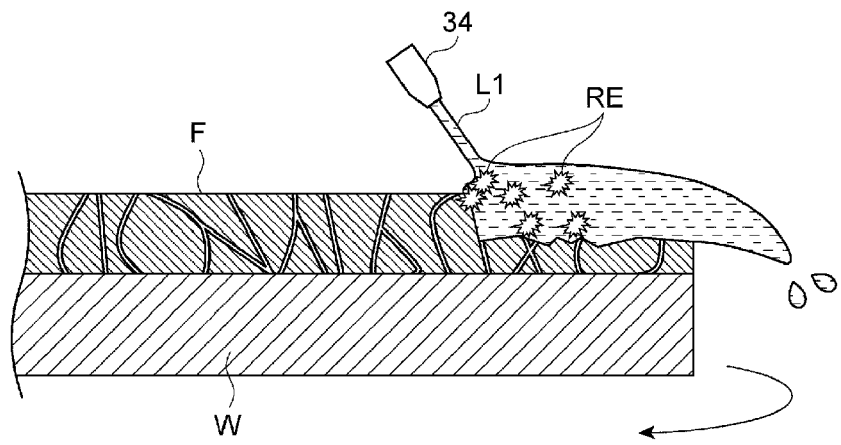
FIG. 9A and FIG. 9B are cross sectional views for describing the example of the substrate processing sequence.

At this time, as shown in FIG. 9A, the etching liquid L1 permeates the crystal grain boundary B before the metal polycrystalline film F is dissolved, and the metal polycrystalline film F is partially peeled off at the crystal grain boundary B. Accordingly, a part of the peeled metal polycrystalline film F remains in the etching liquid L1 without being dissolved, so that the etching residues RE are generated.

Figure 11:
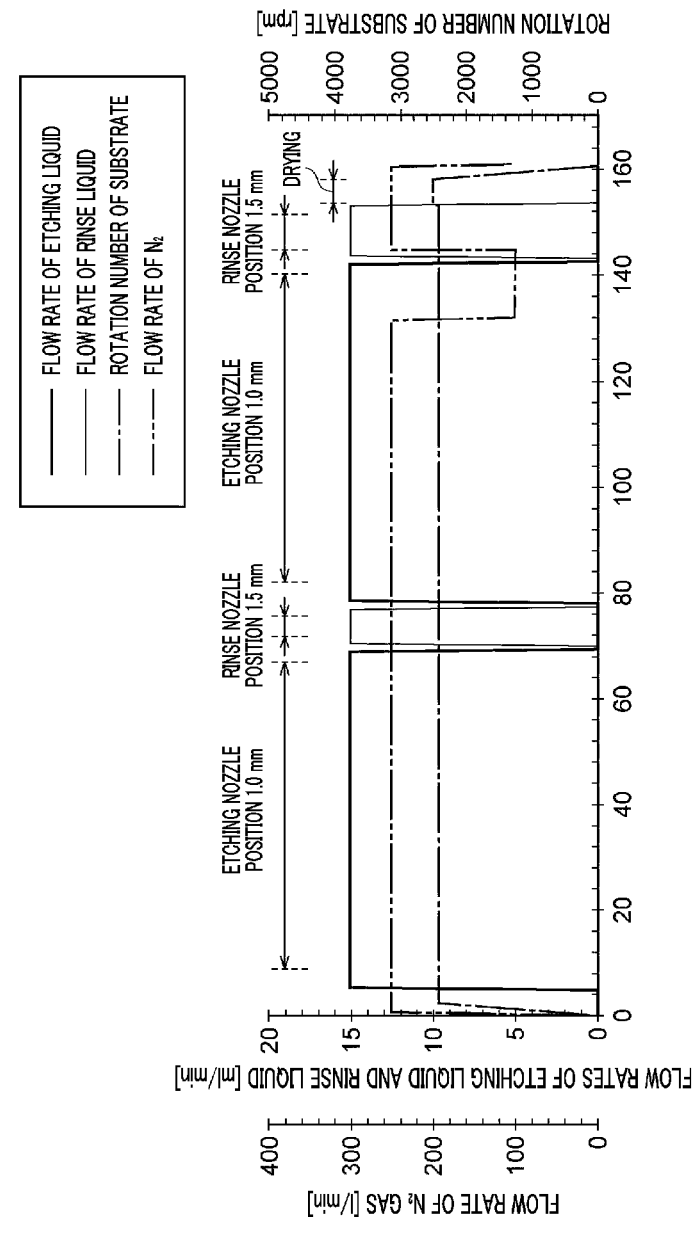
FIG. 11 is a diagram illustrating variations of flow rates of liquids, a flow rate of a gas and a rotation number of a substrate with a lapse of time in an example of a substrate processing.

In the process S11, the etching liquid L1 may be supplied onto the substrate W under the following processing conditions, for example (see FIG. 11).

Rotation number of the substrate W: about 2400 rpm

Liquid landing point of the etching liquid L1: about 1.0 mm from the edge of the substrate W Supply time of the etching liquid L1: about 70 seconds Discharge flow rate of the etching liquid L1: about 15 ml/min In addition, prior to the process S11, the controller Ctr may control the heating device 50 to supply the heated inert gas to the substrate W. In this case, the substrate W is heated to the preset temperature, and the etching of the metal polycrystalline film F by the etching liquid L1 is accelerated. As illustrated in FIG. 11, a supply flow rate of the inert gas may be about 250 l/min.

Figure 7:
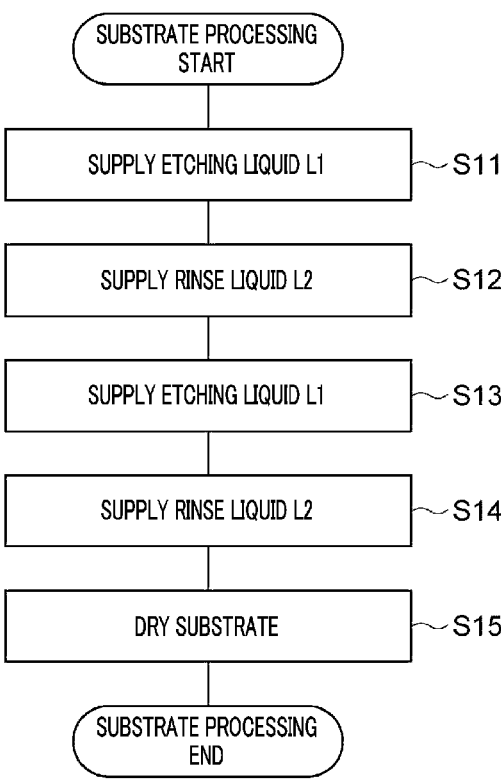
FIG. 7 is a flowchart for describing an example of a substrate processing sequence.
Figures 8A, 8B, 8C, 8D, 8E:
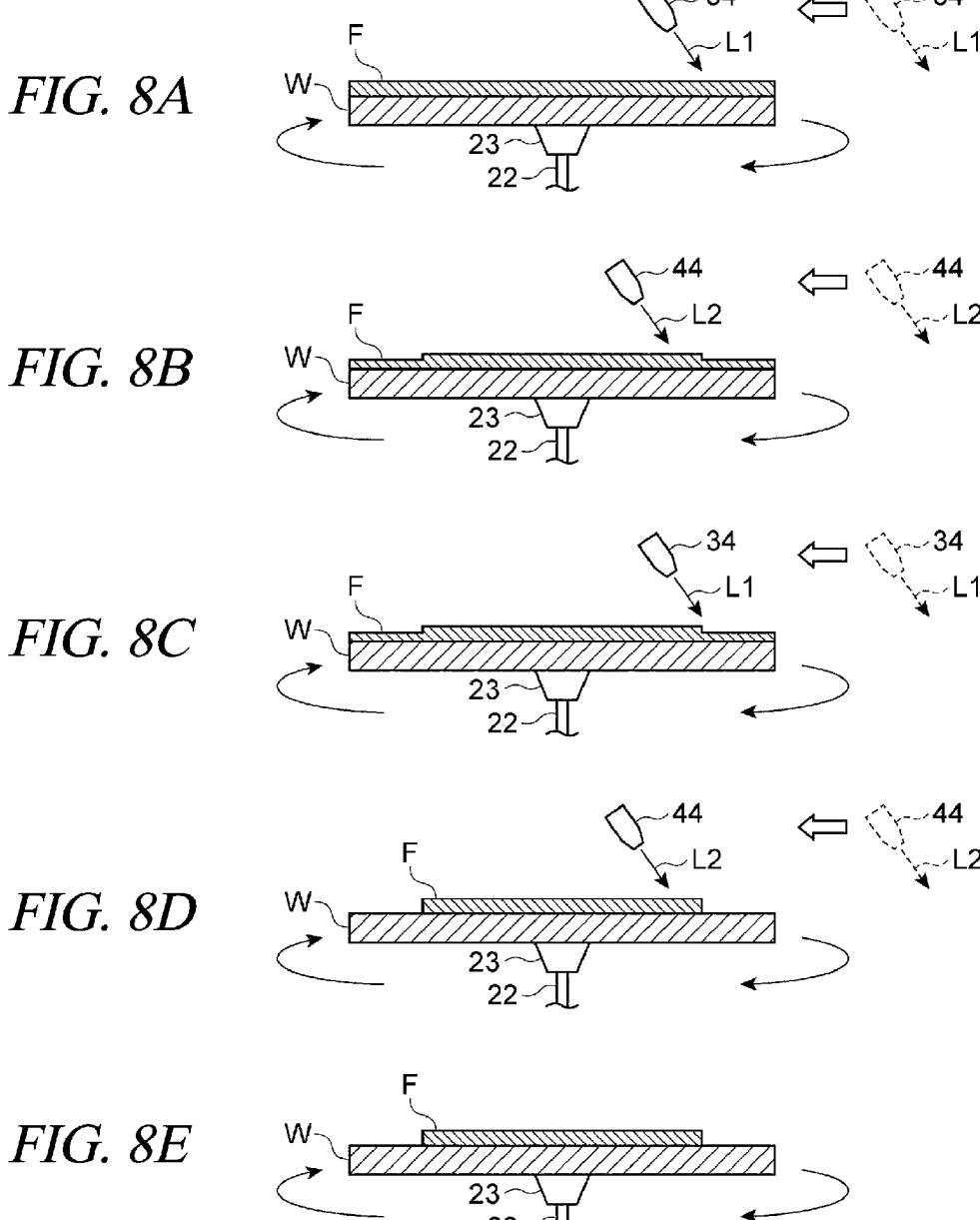
FIG. 8A to FIG. 8E are cross sectional views for describing the example of the substrate processing sequence.

Then, the controller Ctr controls the rotating/holding device 20 and the rinse liquid supply 40 to supply the rinse liquid L2 from the nozzle 44 onto the peripheral portion We of the substrate W for a preset time while carrying on the rotation of the substrate W (see process S12 of FIG. 7 and FIG. 8B). For example, as shown in FIG. 8B, the driving mechanism 46 may move the nozzle 44 from the outside of the substrate W to the center side of the substrate W beyond the edge of the substrate W in the state that the rinse liquid L2 is being discharged from the nozzle 44. Upon the lapse of the preset time, the driving mechanism 46 may move the nozzle 44 to the outside of the substrate W from the center side of the substrate W beyond the edge of the substrate W in the state that the rinse liquid L2 is still being discharged from the nozzle 44.

Figure 9B:
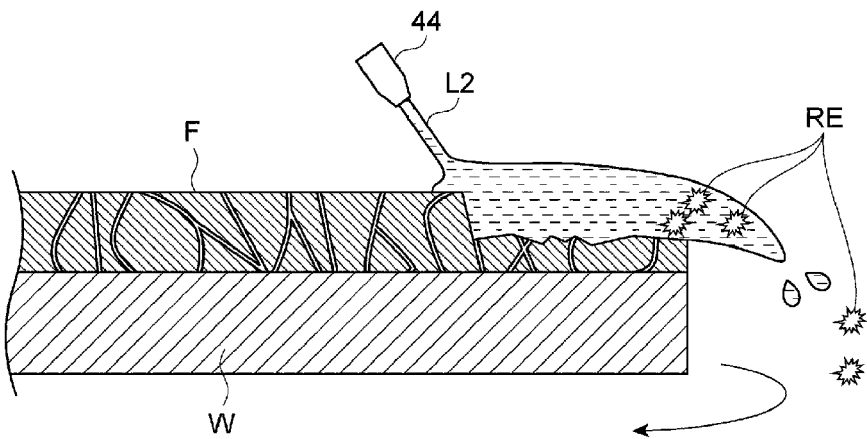

The rinse liquid L2 supplied onto a certain point of the peripheral portion Wc is diffused to the whole peripheral portion Wc along the entire circumference of the substrate W by the rotation of the substrate W, and is scattered outwards from the edge of the substrate W. For this reason, while the supply of the rinse liquid L2 from the nozzle 44 is being carried on, a liquid film of the rinse liquid L2 is formed on the peripheral portion Wc. As a result, as shown in FIG. 9B, the etching residues RE generated in the process S11 are washed away by the rinse liquid L2.

In the process S12, the rinse liquid L2 may be supplied onto the substrate W under the following processing conditions, for example (see FIG. 11).

Rotation number of the substrate W: about 2400 rpm

Liquid landing point of the rinse liquid L2: about 1.5 mm from the edge of the substrate W Supply time of the rinse liquid L2: about 20 seconds Discharge flow rate of the rinse liquid L2: about 15 ml/min Further, in case that the substrate W is heated by the heating device 50 prior to the process S11, the heating of the substrate W may be carried on in the process S12. In this case as well, the supply flow rate of the inert gas may be about 250 l/min, as shown in FIG. 11.

Subsequently, as in the process S11, the controller Ctr controls the rotating/holding device 20 and the chemical liquid supply 30 to supply the etching liquid L1 onto the peripheral portion Wc of the substrate W from the nozzle 34 for a predetermined time while carrying on the rotation of the substrate W (see process S13 of FIG. 7 and FIG. 8C). In the process S13, the driving mechanism 36 may move the nozzle 34 from the outside of the substrate W to the center side of the substrate W beyond the edge of the substrate Win the state that the etching liquid L1 is being discharged from the nozzle 34, as illustrated in FIG. 8C, the same as in the process S11. Upon the lapse of the predetermined time, the driving mechanism 36 may move the nozzle 34 to the outside of the substrate W from the center side of the substrate W beyond the edge of the substrate W in the state that the etching liquid L1 is still being discharged from the nozzle 34.

Figure 10A:
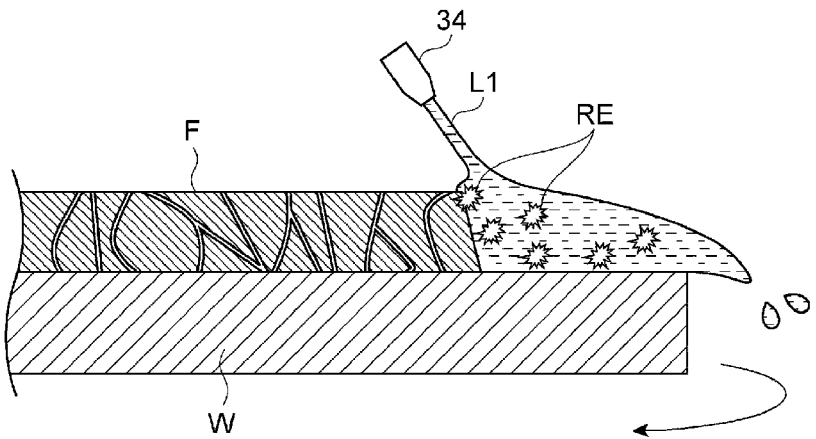
FIG. 10A and FIG. 10B are cross sectionals view for describing an example of the substrate processing sequence following FIG. 9A and FIG. 9B.
Figure 10B:
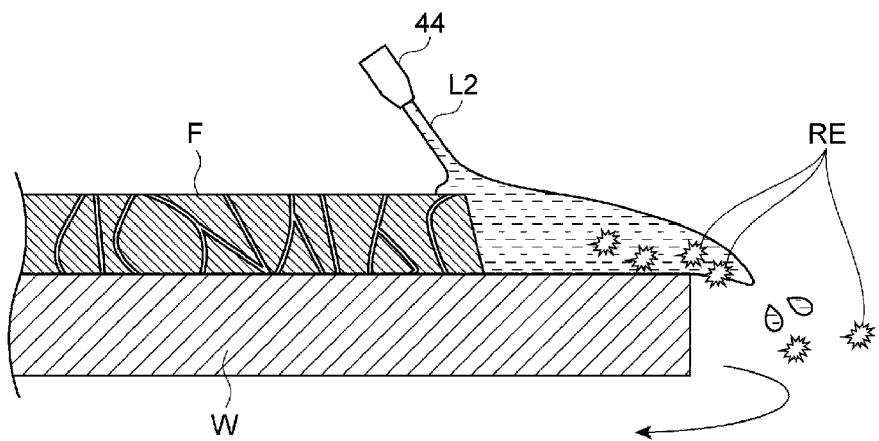

In the process S13, the whole portion of the metal polycrystalline film F located at the peripheral portion Wc is etched by the etching liquid L1. At this time, as shown in FIG. 10A, the etching residues RE are generated, the same as in the process S11. In the process S13, the etching liquid L1 may be supplied to the substrate W under the same processing conditions as in the process S11, for example (see FIG. 11).

Further, in case that the substrate W is heated by the heating device 50 prior to the process S11, the heating of the substrate W may be carried on in the process S13. In this case as well, the supply flow rate of the inert gas may be about 250 l/min. Alternatively, as illustrated in FIG. 11, the controller Ctr may control the heating device 50 to reduce the supply flow rate of the inert gas to, e.g., about 100 l/min before the supply of the etching liquid L1 is stopped. In this case, before the rinse liquid L2 is supplied to the substrate Win a subsequent process S14, the temperature of the substrate W decreases.

Next, the same as in the process S12, the controller Ctr controls the rotating/holding device 20 and the rinse liquid supply 40 to supply the rinse liquid L2 onto the peripheral portion Wc of the substrate W from the nozzle 44 for a preset time while carrying on the rotation of the substrate W (see the process S14 of FIG. 7 and FIG. 8D). In the process S14, the driving mechanism 46 may move the nozzle 44 from the outside of the substrate W to the center side of the substrate W beyond the edge of the substrate W in the state that the rinse liquid L2 is being discharged from the nozzle 44, as illustrated in FIG. 8D, the same as in the process S12. Upon the lapse of the preset time, the driving mechanism 46 may move the nozzle 44 to the outside of the substrate W from the center side of the substrate W beyond the edge of the substrate W in the state that the rinse liquid L2 is still being discharged from the nozzle 44.

The rinse liquid L2 supplied onto a certain point of the peripheral portion Wc is diffused to the whole peripheral portion Wc along the entire circumference of the substrate W by the rotation of the substrate W, and is scattered outwards from the edge of the substrate W, the same as in the process S12. For this reason, in the process S14, the etching residues RE generated in the process S13 are washed away by the rinse liquid L2, as illustrated in FIG. 1013.

In the process S14, the rinse liquid L2 may be supplied to the substrate W under the following processing conditions, for example (see FIG. 11).

Rotation number of the substrate W: about 2400 rpm
Liquid landing point of the rinse liquid L2: about 1.5 mm from the edge of the substrate W
Supply time of the rinse liquid L2: about 30 seconds
Discharge flow rate of the rinse liquid L2: about 15 ml/min Furthermore, in case that the substrate W is heated by the heating device 50 prior to the process S11, the heating of the substrate W may be carried on in the process S14. In this case as well, the supply flow rate of the inert gas may be about 250 l/min. Alternatively, as illustrated in FIG. 11, if the supply flow rate of the inert gas is reduced in the prior process S13, the controller Ctr may control the heating device 50 to increase the supply flow rate of the inert gas to, e.g., about 250 l/min after the rinse liquid L2 is supplied. In this case, before drying of the substrate W is begun in a subsequent process S15, the temperature of the substrate W increases.

Subsequently, the controller Ctr controls the rotating/holding device 20 to carry on the rotation of the substrate W. Accordingly, the rinse liquid L2 is scattered off substrate W, so that the substrate W is dried (see the process S15 of FIG. 7 and FIG. 8E). Through the above-described processes, the processing of the substrate W is completed.

In the process S15, the substrate W may be dried under the following processing conditions, for example (see FIG. 11).

Rotation number of the substrate W: about 2500 rpm
Drying time of the substrate W: about 20 seconds Furthermore, in case that the substrate W is heated by the heating device 50 prior to the process S11, the heating of the substrate W may be carried on in the process S15. In this case as well, the supply flow rate of the inert gas may be about 250 I/min, as depicted in FIG. 11, for example.

[Effects]

Figure 12A:
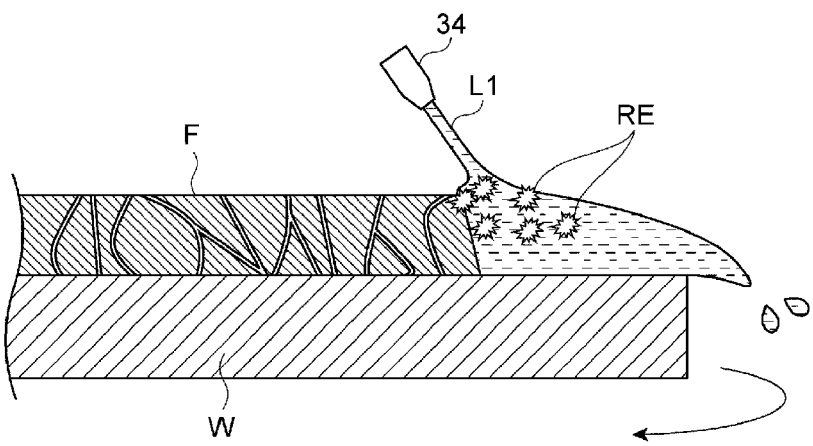
FIG. 12A to FIG. 12C are cross sectional views for describing a comparative example of the substrate processing sequence.
Figure 12B:
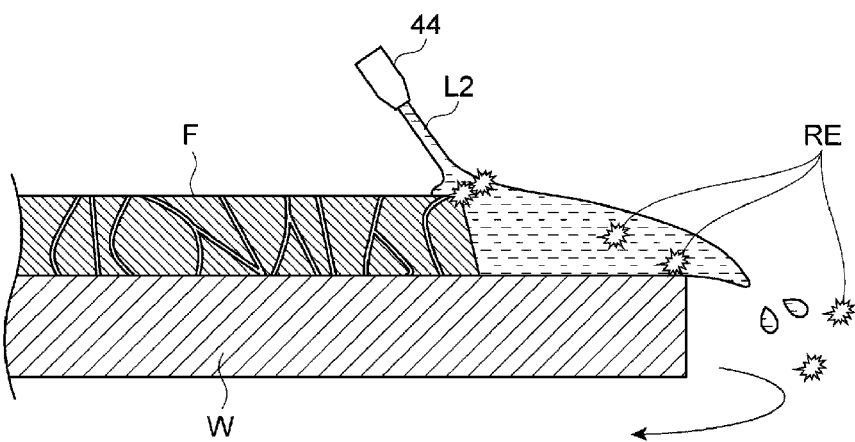
Figure 12C:
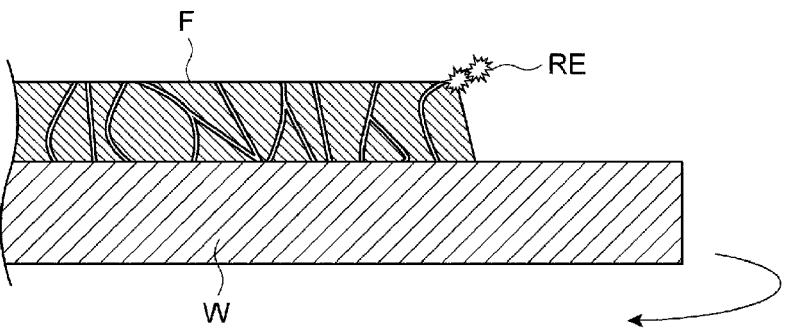

If, however, the etching liquid L1 is supplied to the metal polycrystalline film F and the etching residues RE are thus generated (see FIG. 12A), most of the etching residues RE may be removed from the substrate W by being carried by the etching liquid L1. Some of the etching residues RE, however, may gather at an interface (gas-liquid interface) between the etching liquid L1 and the atmosphere. Once the etching residues RE are dried and solidified, they may not be removed from the substrate W (see FIG. 12C) even if the rinse liquid L2 is supplied to the substrate W later (see FIG. 12B).

However, according to the above-described exemplary embodiment, the rinse liquid L2 is supplied while performing the etching of the metal polycrystalline film F (process S12). Accordingly, the etching residues RE generated during the etching of the metal polycrystalline film F is once washed away by the rinse liquid L2 before they are dried and solidified. Therefore, when etching the metal polycrystalline film F formed on the front surface Wa of the substrate W, it becomes possible to effectively remove the etching residues RE.

In the above-described exemplary embodiment, in the processes S11 to S15, the heating device 50 may heat the substrate W such that the temperature of the substrate W before and after the start of the supply of the rinse liquid L2 in the process S14 is relatively low. In this case, since the temperature of the substrate W before and after the start of the supply of the rinse liquid L2 in the process S14 is relatively low, the drying and the solidification of the etching residues RE are suppressed. On the other hand, since the temperature of the substrate W is relatively high except before and after the start of the supply of the rinse liquid L2 in the process S14, the etching of the metal polycrystalline film F is accelerated. For this reason, it becomes possible to achieve both speed-up of the etching processing and effective removal of the etching residues RE. In addition, the heating device 50 may heat the substrate W so that the temperature of the substrate becomes relatively low before and after the start of the supply of the rinse liquid L2 in the process S12 (during the etching processing of the metal polycrystalline film F) as well as before and after the start of the supply of the rinse liquid L2 in the process S14 (immediately before the drying of the substrate W).

[Modification Examples]

It should be noted that the disclosure of the present specification is illustrative in all aspects and is not anyway limiting. The above-described exemplary embodiment may be omitted, replaced and modified in various ways without departing from the scope and the spirit of claims.

(1) In the above-described exemplary embodiment, in order to etch the metal polycrystalline film F formed on the front surface Wa of the substrate W, the etching liquid L1 and the rinse liquid L2 are supplied toward the front surface Wa from above the substrate W. However, when the metal polycrystalline film F is formed on the rear surface Wb of the substrate W, the etching liquid L1 and the rinse liquid L2 may be supplied toward the rear surface Wb from below the substrate W.

Figure 13:
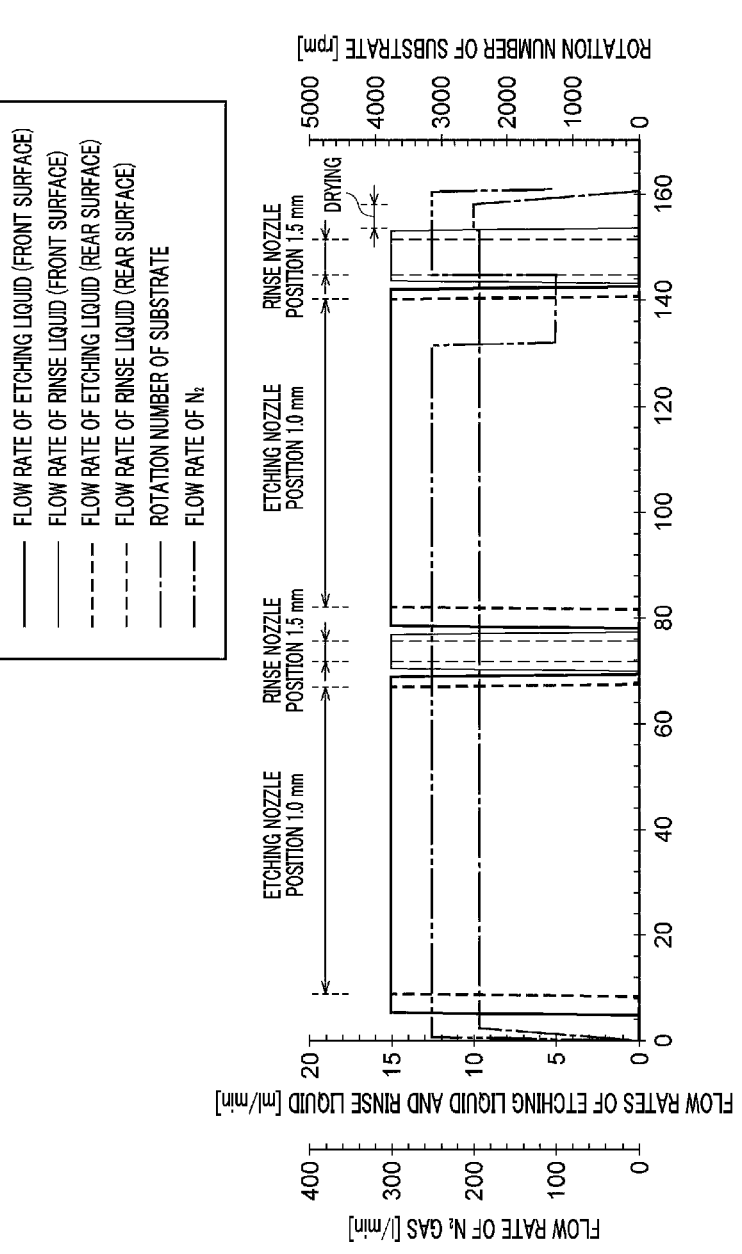
FIG. 13 is a diagram illustrating variations of flow rates of liquids, a flow rate of a gas and a rotation number of a substrate with a lapse of time in another example of the substrate processing.
Figures 14A, 14B, 14C, 14D, 14E:
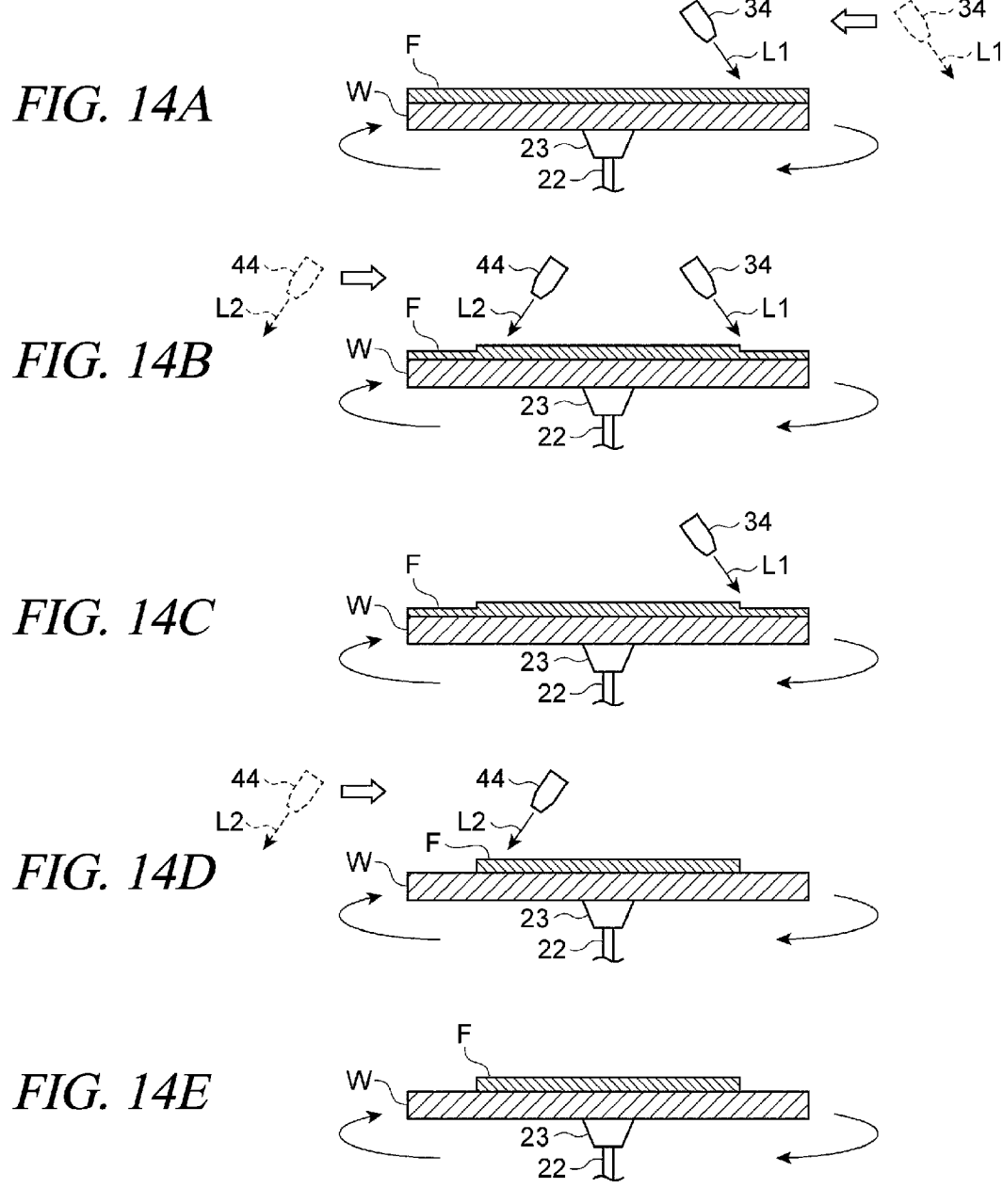
FIG. 14A to FIG. 14E are diagrams for describing another example of the substrate processing sequence.

Alternatively, when the metal polycrystalline film F is formed on both surfaces of the substrate W, the etching liquid L1 and the rinse liquid L2 may be supplied toward the front surface Wa and the rear surface Wb from above and below the substrate W. In this case, as illustrated in FIG. 13, the supply of the etching liquid L1 to the rear surface Wb may be begun after the supply of the etching liquid L1 to the front surface Wa is started, and the supply of the etching liquid L1 to the front surface Wa may be stopped after the supply of the etching liquid L1 to the rear surface Wb is stopped. Likewise, the supply of the rinse liquid L2 to the rear surface Wb may be begun after the supply of the rinse liquid L2 to the front surface Wa is started, and the supply of the rinse liquid L2 to the front surface Wa may be stopped after the supply of the rinse liquid L2 to the rear surface Wb is stopped. In these cases, it becomes possible to suppress the etching liquid L1 or the rinse liquid L2 from flowing to the front surface Wb from the rear surface Wb.

Figure 15:
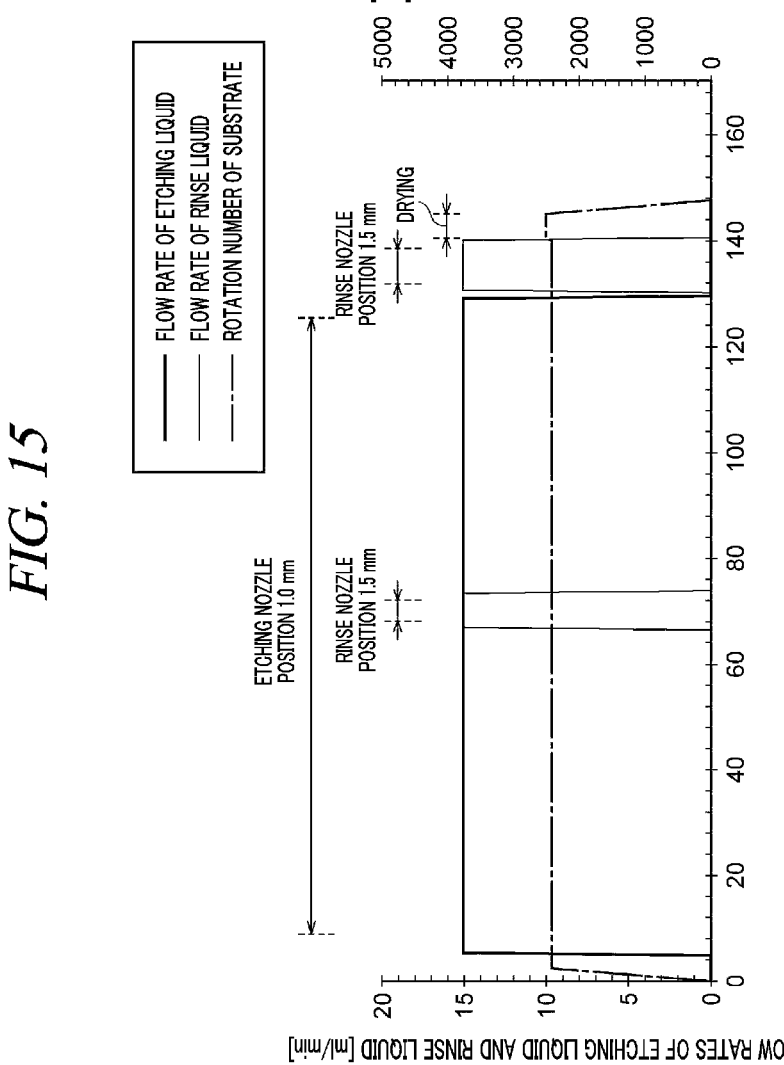
FIG. 15 is a diagram illustrating variations of flow rates of liquids and a rotation number of a substrate with a lapse of time in another example of the substrate processing.

(2) As illustrated in FIG. 14A to FIG. 14C and FIG. 15, during the etching processing of the metal polycrystalline film F, the rinse liquid L2 may be supplied to the substrate W while the supply of the etching liquid L1 is continued (while the etching liquid L1 is being discharged from the nozzle 34). Then, as illustrated in FIG. 14D and FIG. 14E and FIG. 15, the last supply of the rinse liquid L2 and the drying of the substrate W may be performed, the same as in the processes S14 and S15. In this case, since the supply of the liquid (the etching liquid L1 or the rinse liquid L2) to the substrate W is continued (not stopped), the peripheral portion Wc remains wet, and the etching residues RE are difficult to dry and solidify. For this reason, it becomes possible to remove the etching residues RE more effectively.

Figure 16:
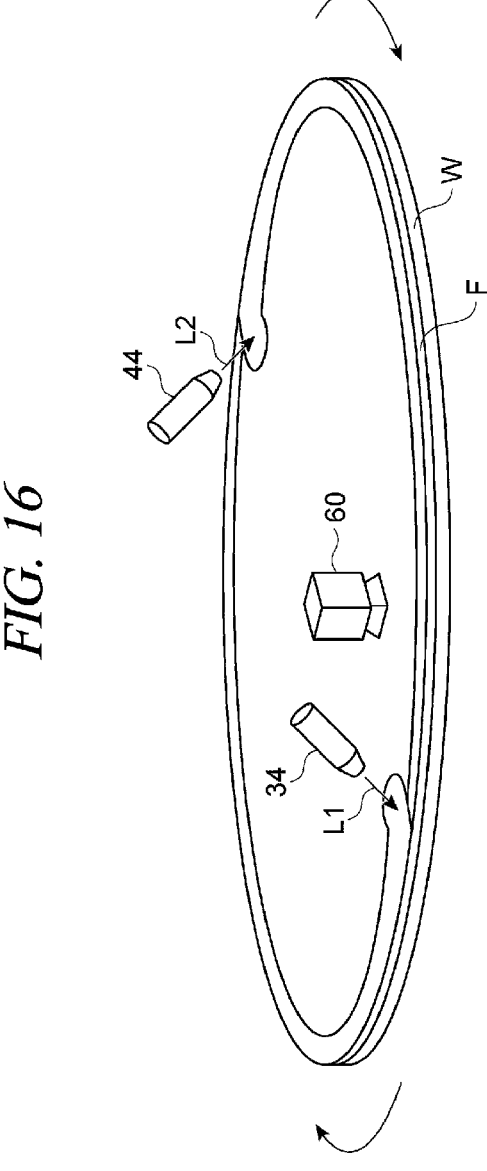
FIG. 16 is a perspective view illustrating a part of another example of the processing unit.

When the etching liquid L1 and the rinse liquid L2 are simultaneously supplied to the substrate W, the nozzles 34 and 44 may be provided at the same arm (not shown) or at different arms (not shown). That is, the nozzles 34 and 44 may be physically adjacent to each other, or may be physically spaced apart from each other. In the latter case, when the etching liquid L1 and the rinse liquid L2 are simultaneously supplied to the substrate W, splashing of the liquid is less likely to occur. Moreover, as illustrated in FIG. 16, the nozzle 34 and the nozzle 44 may be arranged to face each other with substrate W therebetween.

Figure 17:
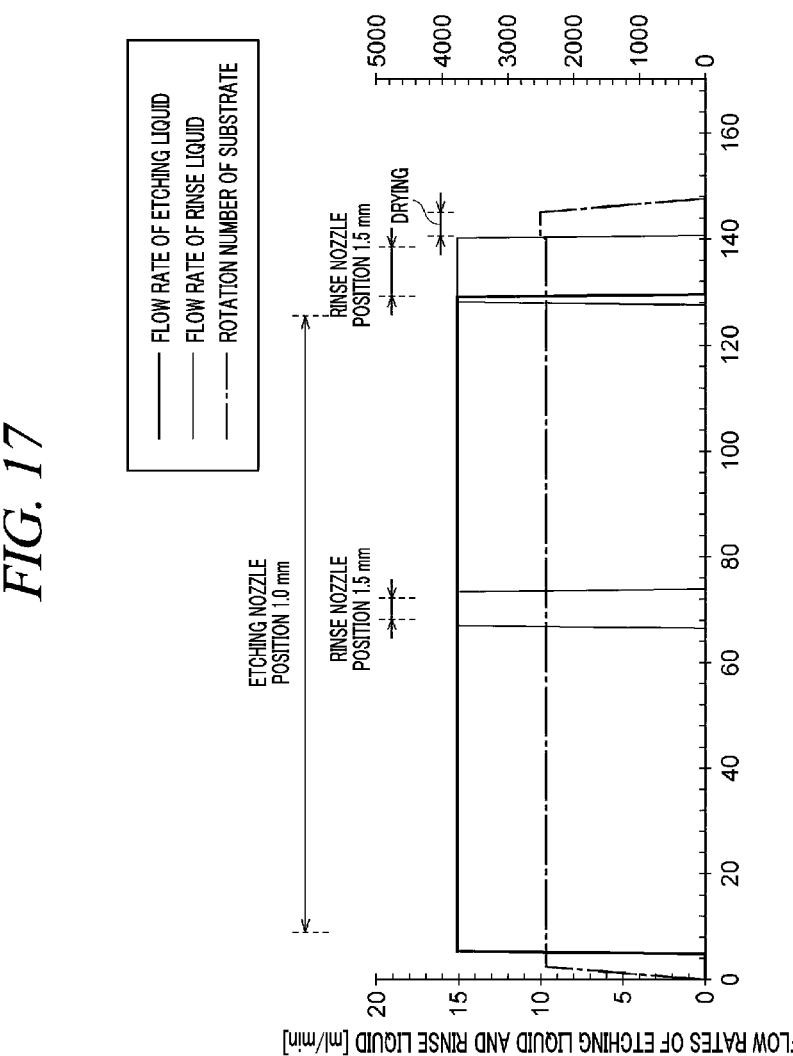
FIG. 17 is a diagram illustrating variations of flow rates of liquids and a rotation number of a substrate with a lapse of time in yet another example of the substrate processing.

(3) Although not shown, the last supply of the rinse liquid L2 (for example, the process S14) may be begun before the supply of the etching liquid L1 to the substrate W started in the previous stage (for example, the process S13) is stopped. Alternatively, as illustrated in FIG. 17, the last supply of the rinse liquid L2 may be started during the supply of the etching liquid L1. In any of these cases, since the supply of the liquid (the etching liquid L1 or the rinse liquid L2) to the substrate W is continued (not stopped), the peripheral portion Wc remains wet, and the etching residues RE are difficult to dry and solidify. For this reason, it becomes possible to remove the etching residue RE more effectively.

(4) However, if the etching residue RE is generated, a difference in the contrast between the etching residue RE and the vicinity thereof tends to increase. Thus, the controller Ctr may determine whether or not the etching residue RE has been generated at the peripheral portion Wc based on the image captured by the imaging device 60. Specifically, the controller Ctr may make a determination that the etching residue RE has been generated when a change in the contrast (for example, a change in a luminance value) equal to or larger than a preset threshold value is detected in the captured image. In this case, it becomes possible to automatically detect the presence or absence of the etching residue RE by the image processing.

When it is determined that the etching residue RE has been generated, the controller Ctr may control the rinse liquid supply 40 to supply the rinse liquid L2 to the substrate W. In this case, if the etching residue RE is generated, this etching residue RE is automatically washed away by the rinse liquid L2. Therefore, the efficiency of the substrate processing can be improved as compared to a case where the start and the stop of the supply of the etching liquid L1 and the rinse liquid L2 are performed based on a preset processing condition.

The controller Ctr may also determine whether the interval of the generation of the etching residue RE is too short or too long as compared to a predetermined reference value. If it is determined that the interval of the generation of the etching residue RE is too shorter or too longer than the predetermined reference value, the progress of the etching of the metal polycrystalline film F may be regarded as being too fast or too slow, and the controller Ctr may change at least one of the various processing conditions. The processing conditions may include, by way of example, the position of the nozzle 34, the position of the nozzle 44, the moving speed of the nozzle 34, the moving speed of the nozzle 44, the flow rate of the etching liquid L1, the flow rate of the rinse liquid L2, the supply time of the etching liquid L1, the supply time of the rinse liquid L2, the temperature of the substrate W (the flow rate of the inert gas, the temperature of the inert gas, etc.), the rotation number of the substrate W, and so forth.

Figure 18:
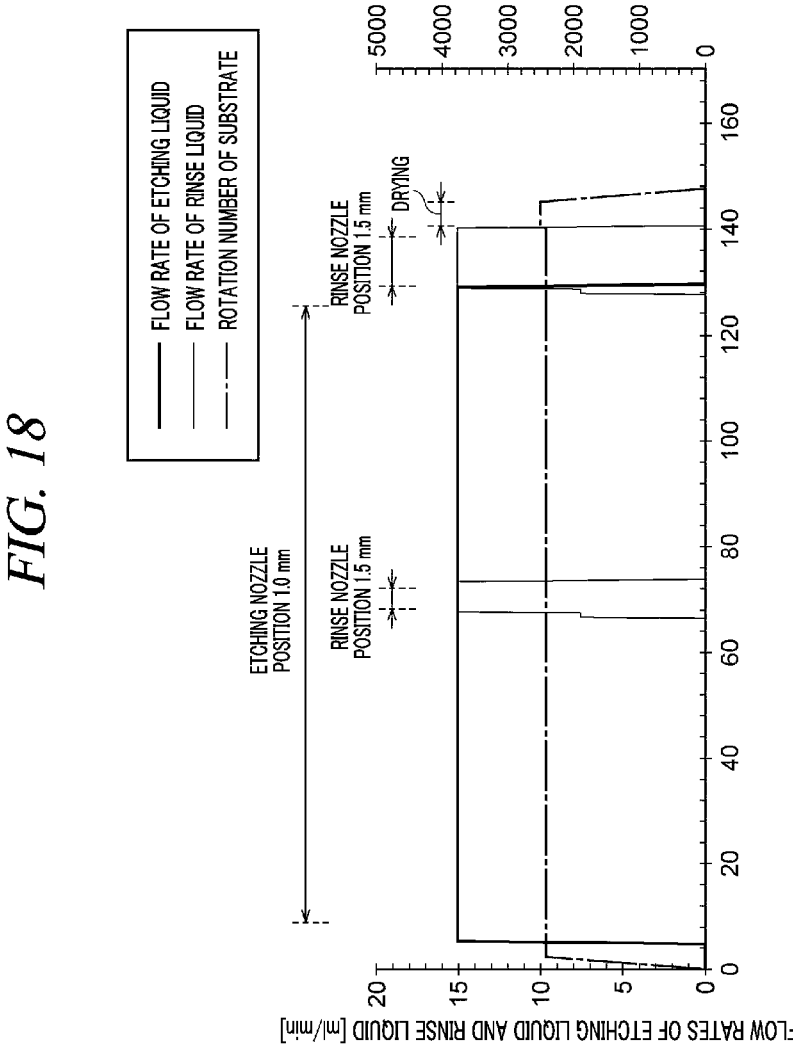
FIG. 18 is a diagram illustrating variations of flow rates of liquids and a rotation number of a substrate with a lapse of time in still another example of the substrate processing.

(5) In the processes S12 and S14, when moving the nozzle 44 from the outside of the substrate W to the center side of the substrate W beyond the edge of the substrate W while discharging the rinse liquid L2 from the nozzle 44, the flow rate of the rinse liquid L2 may be changed before and after the nozzle 44 crosses the edge of the substrate W. For example, as illustrated in FIG. 18, the rinse liquid L2 may be discharged at a first flow rate (e.g., about 7.5 ml) until the nozzle 44 crosses the edge of the substrate W. Then, after the nozzle 44 crosses the edge of the substrate W, the rinse liquid L2 may be discharged from the nozzle 44 at a second flow rate (e.g., about 15.0 ml) larger than the first flow rate.

In this case, the flow rate of the rinse liquid L2 from the nozzle 44 when the nozzle 44 is crossing the edge of the substrate W is relatively small. Therefore, even if the rinse liquid L2 discharged from the nozzle 44 collides with the liquid film of the etching liquid L1 previously supplied on the substrate W, the splashing of the etching liquid L1 is less likely to occur. Thus, it becomes possible to suppress the contamination of the substrate W that is caused by the diffusion of the etching liquid L1 into the atmosphere. Once the rinse liquid L2 is supplied onto the substrate W, on the other hand, the flow rate of the rinse liquid L2 from the nozzle 44 becomes relatively large. Accordingly, the etching residues RE can be effectively removed from the substrate W.

Figures 19A, 19B:
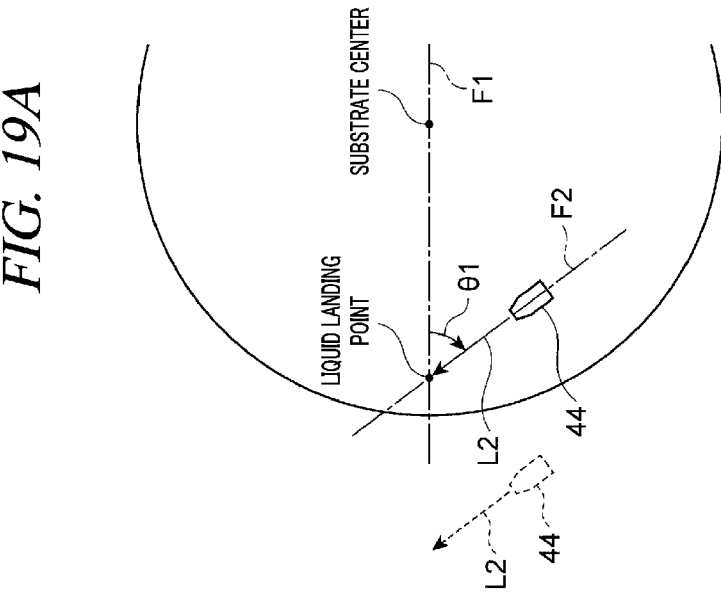
FIG. 19A and FIG. 19B are top views for describing a change in a discharge angle of a rinse liquid from a nozzle in still yet another example of the substrate processing.

(6) In the processes S12 and S14, when moving the nozzle 44 from the outside of the substrate W to the center side of the substrate W beyond the edge of the substrate W while discharging the rinse liquid L2 from the nozzle 44, a discharge angle of the rinse liquid L2 from the nozzle 44 may be changed. Here, referring to FIG. 19A and FIG. 19B, the discharge angle may be defined as an angle of a flow line F2 of the rinse liquid connecting the liquid landing point of the rinse liquid L2 discharged from the nozzle 44 on the substrate W and the discharge opening 44a of the nozzle 44 with respect to a reference line F1 connecting the liquid landing point and the center of the substrate W. For example, until the nozzle 44 crosses the edge of the substrate W, the rinse liquid L2 may be discharged from the nozzle 44 at a first discharge angle θ1 (e.g., about 30° to about 70°) (see FIG. 19A). Then, after the nozzle 44 crosses the edge of the substrate W, the rinse liquid L2 may be discharged from the nozzle 44 at a second discharge angle θ2 (e.g., about 70° to about 90°) larger than the first discharge angle θ1 (see FIG. 19B).

In this case, the discharge angle of the rinse liquid L2 when the nozzle 44 is crossing the edge of the substrate W is relatively small (first discharge angle θ1). That is, the rinse liquid L2 discharged from the nozzle 44 tends to head toward the outside of the substrate W in the diametrical direction of the substrate W. Therefore, even if the splashing of the etching liquid L1 occurs when the rinse liquid L2 discharged from the nozzle 44 collides with the liquid film of the etching liquid L1 previously supplied on the substrate W, the etching liquid L1 may be easily diffused toward the outside of the substrate W. Accordingly, since it becomes difficult for the diffused etching liquid L1 to adhere to the substrate W, the contamination of the substrate W can be suppressed. Meanwhile, once the rinse liquid L2 is supplied to the substrate W, the discharge angle becomes relatively large (second discharge angle θ2). That is, when viewed from the liquid landing point as a reference, the direction of the flow line F2 of the rinse liquid L2 approaches the direction of a tangent line of the substrate W. Accordingly, the rinse liquid L2 supplied to the substrate W flows on the peripheral portion We of the substrate W over a wider range. Therefore, the etching residues RE can be washed away from the substrate W effectively.

Figures 20A, 20B, 20C, 20D, 20E:
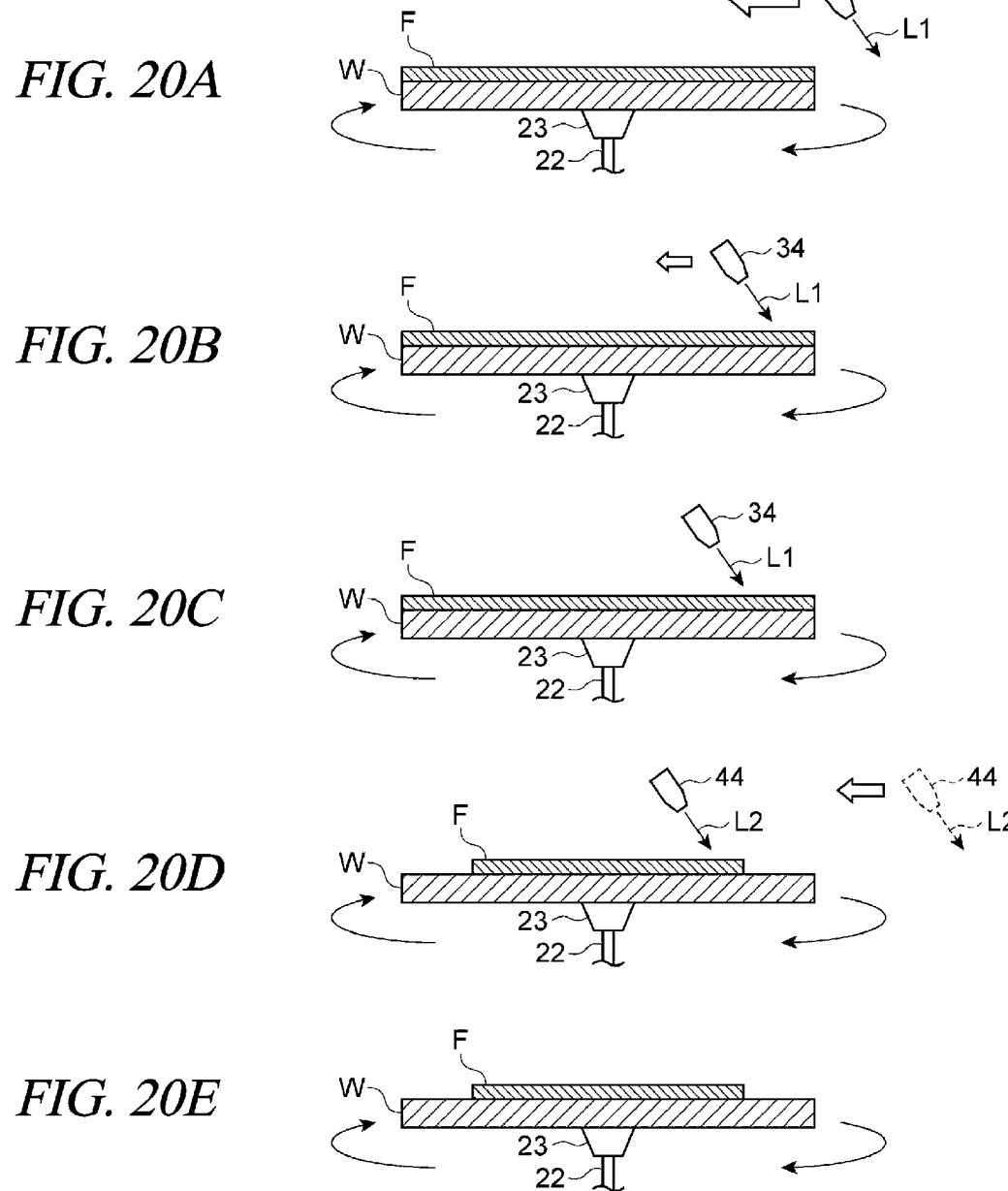
FIG. 20A to FIG. 20E are cross sectional views for describing yet another example of the substrate processing sequence.
Figure 21:
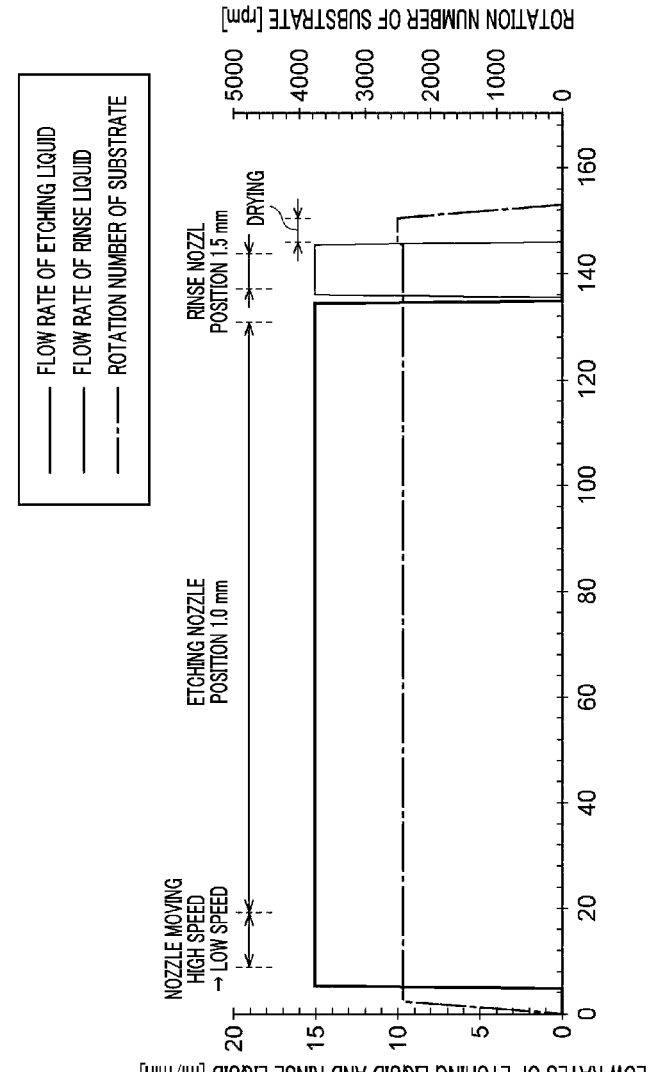
FIG. 21 is a diagram illustrating variations of flow rates of liquids and a rotation number of a substrate with a lapse of time in still yet another example of the substrate processing.

(7) When moving the nozzle 34 from the outside of the substrate W to the center side of the substrate W beyond the edge of the substrate W while discharging the etching liquid L1 from the nozzle 34, the moving speed of the nozzle 34 may be changed. For example, as illustrated in FIG. 20A to FIG. 21, until the nozzle 34 reaches a first position beyond the edge of the substrate W, the nozzle 34 may be moved at a first speed while discharging the etching liquid L1 from the nozzle 34 (see FIG. 20A and FIG. 21). The first position may be, for example, a position where the liquid landing point is about 0.5 mm away from the edge of the substrate W. The first speed may be, e.g., about 10 mm/sec. Until the nozzle 34 reaches a second position (target position) beyond the first position, the nozzle 34 may be moved at a second speed slower than the first speed while carrying on the discharge of the etching liquid L1 from the nozzle 34 (see FIG. 20B, FIG. 20C and FIG. 21). The second position may be, for example, a position where the liquid landing point is about 1.0 mm away from the edge of the substrate W. The second speed may be, e.g., about 0.1 mm/sec. Thereafter, as illustrated in FIG. 20D, FIG. 20E and FIG. 21, the supply of the rinse liquid L2 and the drying of the substrate W may be performed, the same as in the processes S14 and S15.

In this case, the nozzle 34 which is discharging the etching liquid L1 is moved at a relatively low speed from the first position to the second position. For this reason, at the moment when the nozzle 34 reaches the second position and is stopped thereat, an inertial force acting on the etching liquid L1 discharged from the nozzle 34 is reduced, so that it becomes difficult for the etching liquid L1 to flow to the center side of the substrate W. Accordingly, since the diffusion of the etching liquid L1 to the center side of the substrate W is suppressed, it becomes difficult for the etching liquid L1 to stay at the gas-liquid interface. As a result, the etching residues RE become difficult to dry and solidify, so that the etching residues RE can be effectively removed when the rinse liquid L2 is supplied afterwards. Meanwhile, in this case, the nozzle 34 which is discharging the etching liquid L1 is moved at a relatively high speed up to the first position. Accordingly, the total processing time of the etching is shortened. Thus, the efficiency of the substrate processing can be improved.

Figure 22:
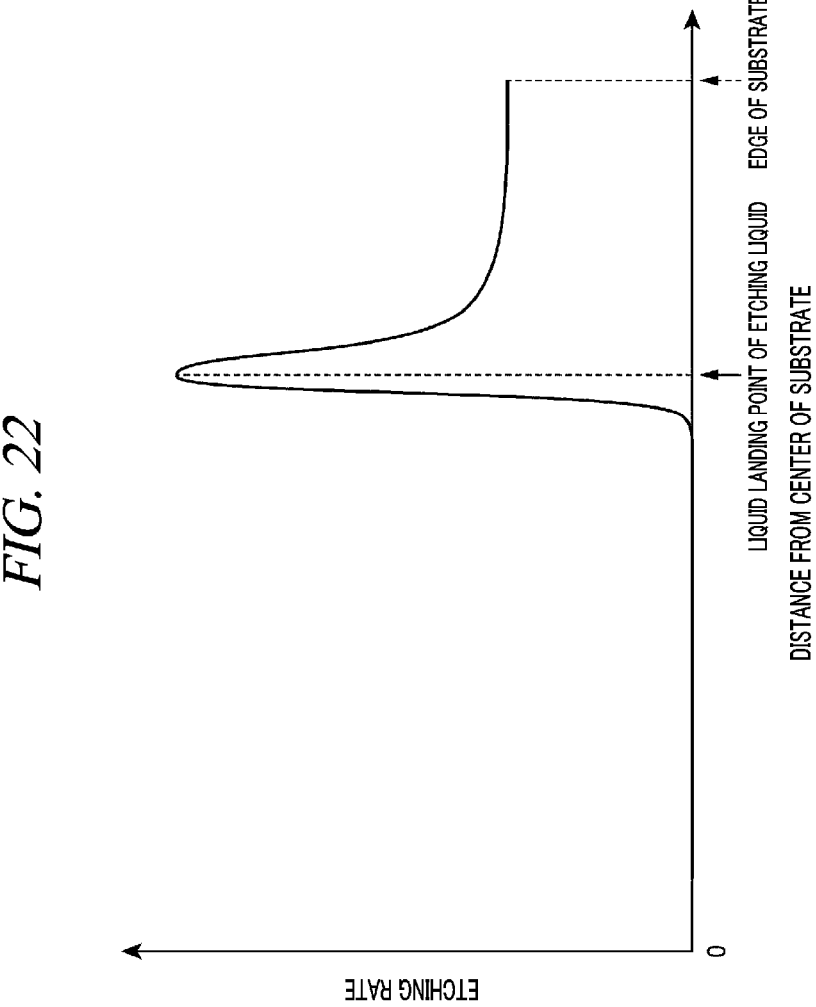
FIG. 22 is a diagram illustrating an example of a relationship between a distance from a center of the substrate and an etching rate of the metal polycrystalline film.

(8) Here, as illustrated in FIG. 22, the etching rate of the metal polycrystalline film F by the etching liquid L1 is the highest at the liquid landing point of the etching liquid L1. For this reason, if the etching processing is performed without changing the position of the nozzle 34 which discharges the etching liquid L1, etching of a portion of the metal polycrystalline film F corresponding to the liquid landing point is completed relatively quickly, whereas it takes a relatively long time until a portion of the metal polycrystalline film F closer to the edge of the substrate W than the liquid landing point is completely etched. In this case, the etching residues become easy to dry and solidify at the gas-liquid interface.

Figures 23A, 23B, 23C, 23D:
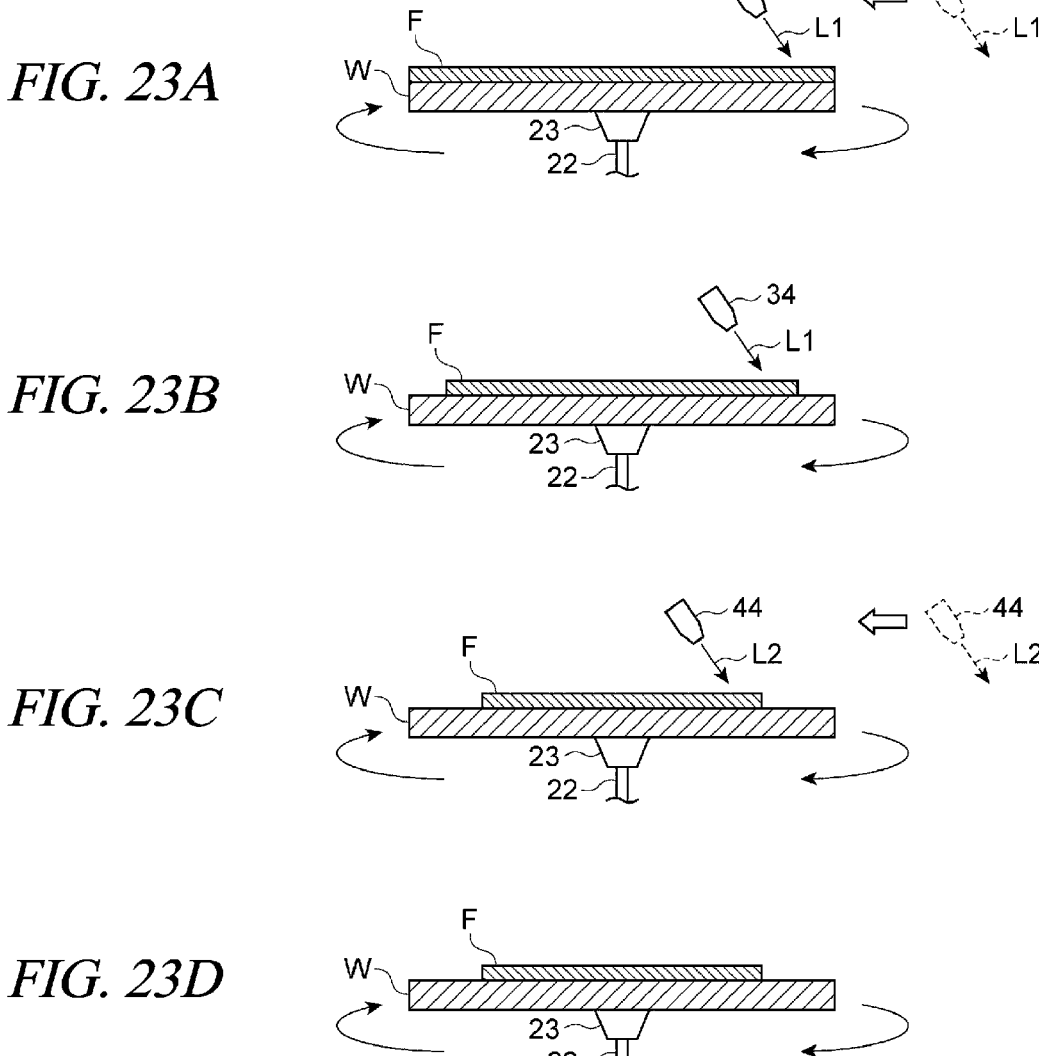
FIG. 23A to FIG. 23D are cross sectional views for describing yet another example of the substrate processing sequence.
Figure 24:
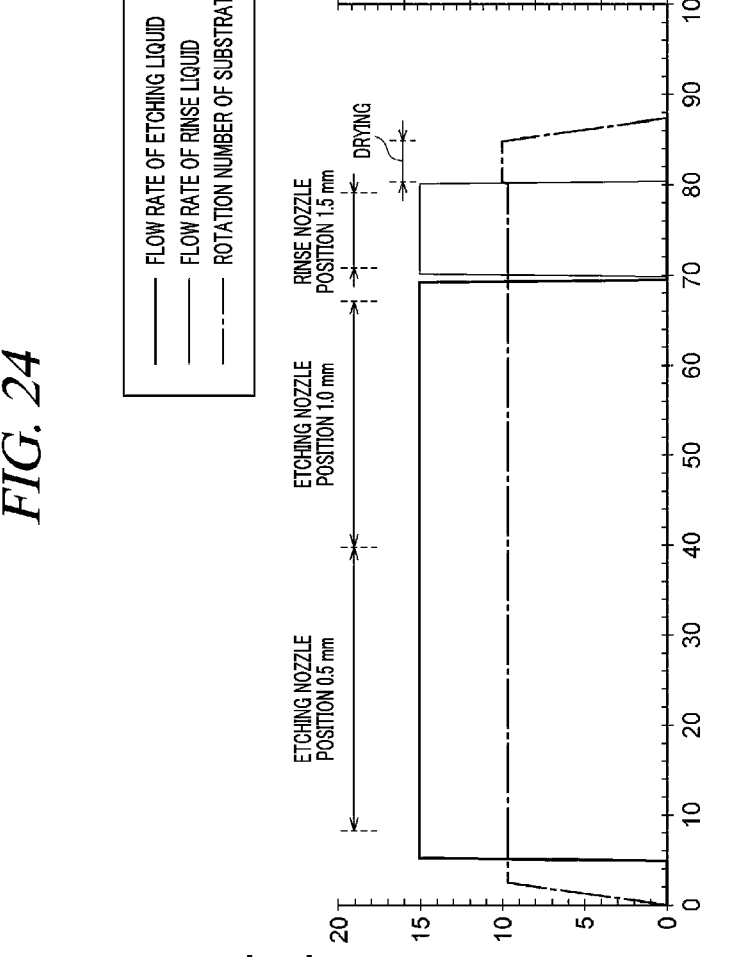
FIG. 24 is a diagram illustrating variations of flow rates of liquids and a rotation number of a substrate with a lapse of time in still yet another example of the substrate processing.

Therefore, as illustrated in FIG. 23A to FIG. 24, by supplying the etching liquid L1 to the first position of the peripheral portion Wc of the substrate W, the metal polycrystalline film F may be first etched at the first position (see FIG. 23A and FIG. 24). The first position may be, for example, the position where the liquid landing point is about 0.5 mm away from the edge of the substrate W. Thereafter, by supplying the etching liquid L1 to the second position which is closer to the center of the substrate W than the first position, the metal polycrystalline film F may be etched at the second position (FIG. 23B and FIG. 24). The second position may be, for example, the position where the liquid landing point is about 1.0 mm away from the edge of the substrate W. Thereafter, as illustrated in FIG. 23C, FIG. 23D and FIG. 24, the supply of the rinse liquid L2 and the drying of the substrate W may be performed, the same as in the processes S14 and S15.

In this case, the etching liquid is first supplied to the first position of the peripheral portion Wc of the substrate W, and then supplied to the second position of the peripheral portion Wc closer to the center of the substrate W than the first position (see FIG. 23A and FIG. 24). For this reason, when etching the metal polycrystalline film F at the second position, the metal polycrystalline film F on the peripheral side with respect to the first position is already etched (see FIG. 23B and FIG. 24). Accordingly, the etching processing at the second position is completed in a relatively short time. As a result, since the etching residues RE become difficult to dry and solidify, it becomes possible to remove the etching residues RE effectively when the rinse liquid L2 is supplied afterwards. Further, in this case, the total processing time of the etching is shortened (see FIG. 24). Accordingly, the efficiency of the substrate processing can be improved.

(9) As illustrated in FIG. 25A to FIG. 27, after the metal polycrystalline film F at the peripheral portion Wc of the substrate W is etched by the etching liquid L1, the rotation number of the substrate W may be reduced. First, the controller Ctr controls the rotating/holding device 20 and the chemical liquid supply 30 to carry on the rotation of the substrate W and supply the etching liquid L1 from the nozzle 34 onto the peripheral portion Wc of the substrate W which is being rotated at a rotation number $\omega1$ (see FIG. 25A and FIG. 27).

Figure 27:
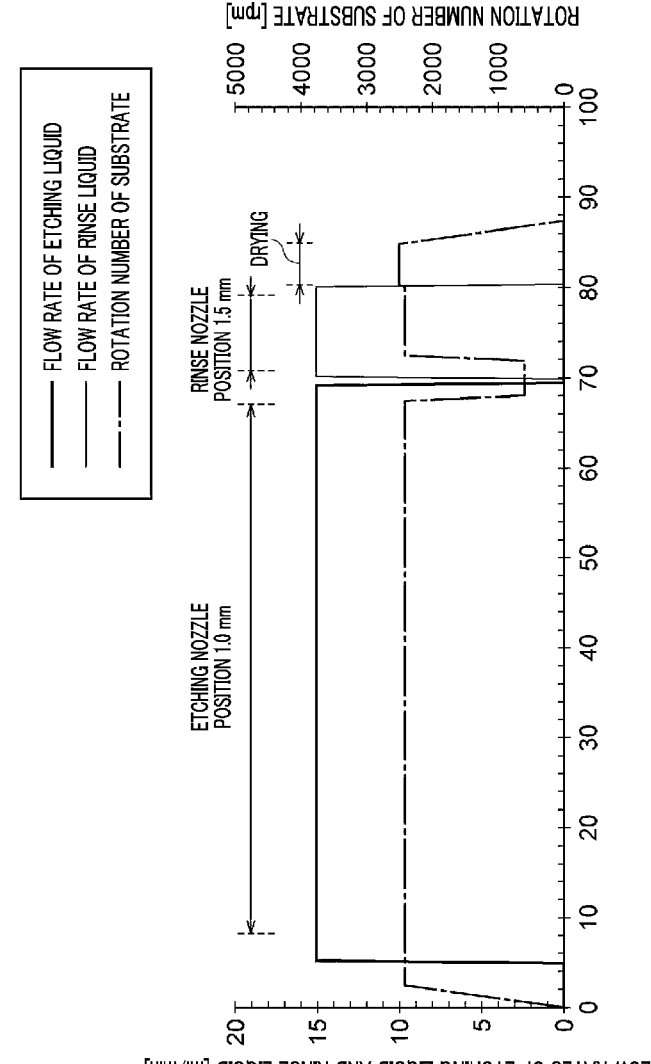
FIG. 27 is a diagram illustrating variations of flow rates of liquids and a rotation number of a substrate with a lapse of time in still yet another example of the substrate processing.

In the supply of the etching liquid L1, the etching liquid L1 may be supplied to the substrate W under the following processing conditions (see FIG. 27).

Figures 25A, 25B, 25C, 25D, 25E, 25F:
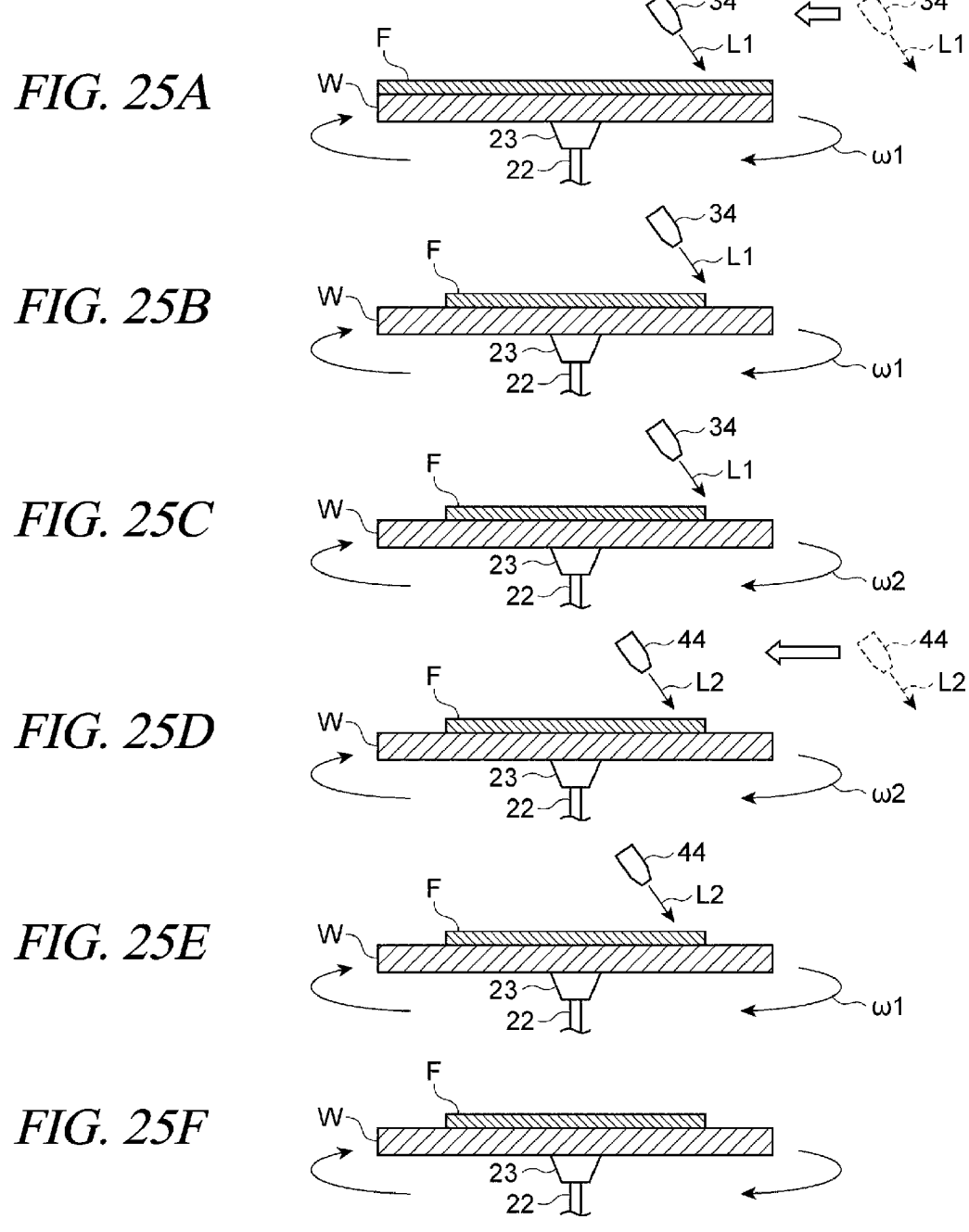
FIG. 25A to FIG. 25F are cross sectional views for describing still yet another example of the substrate processing sequence.
Figure 26A:
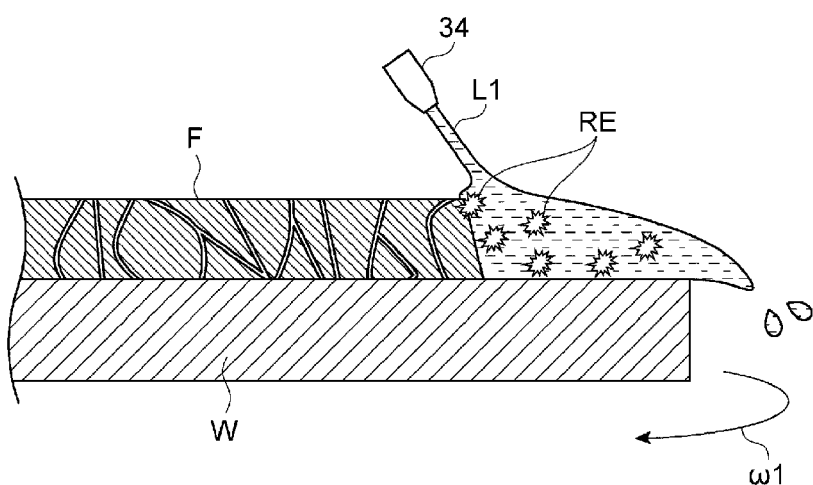
FIG. 26A and FIG. 26B are enlarged views partially illustrating FIG. 25B and FIG. 25C, respectively.

Liquid landing point of the etching liquid L1: about 1.0 mm from the edge of the substrate W Supply time of the etching liquid L1: about 70 seconds Discharge flow rate of the etching liquid L1: about 15 ml/min Accordingly, on the peripheral portion Wc of the substrate W, the metal polycrystalline film F outside the liquid landing point of the etching liquid L1 is removed (see FIG. 25B and FIG. 26A). That is, in the etching processing of the metal polycrystalline film F, most of the etching liquid L1 flows from the liquid landing point toward the edge of the substrate W by a centrifugal force, and then is scattered outwards from the edge of the substrate W. Further, the rotation number $\omega1$ of the substrate W may be, e.g., about 2400 rpm, or may be in the range from about 1200 rpm to about 3000 rpm.

Figure 26B:
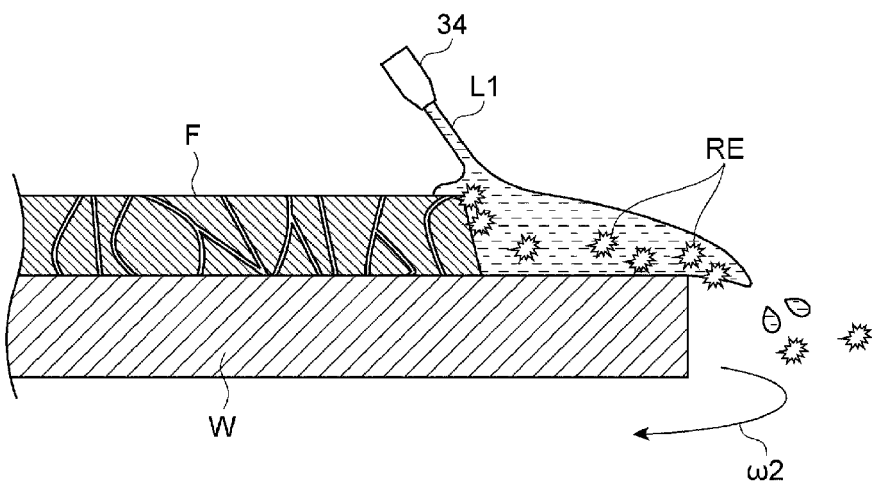

Next, the controller Ctr controls the rotating/holding device 20 and the chemical liquid supply 30 to change the rotation number of the substrate W to a rotation number $\omega2$ in the state that the etching liquid L1 is supplied on the peripheral portion Wc of the substrate W (see FIG. 25C, FIG. 26B, and FIG. 27). The rotation number $\omega2$ of the substrate W is set to be smaller than the rotation number $\omega1$.

The rotation number $\omega2$ of the substrate W may be, e.g., about 600 rpm or may be in the range from about 600 rpm to about 2400 rpm. The rotation number of the substrate W needs to be changed before the supply of the etching liquid L1 is stopped. The timing when the rotation number of the substrate W is changed may be, for example, about 1 second or about 1 second to about 5 seconds before the supply of the etching liquid L1 is stopped. At the time when the rotation number of the substrate W is changed, the nozzle 34 may or may not be moved. At the time when the rotation number of the substrate W is changed, the liquid landing point of the etching liquid L1 may be the same position as before or a different position.

Next, the controller Ctr controls the rotating/holding device 20 and the rinse liquid supply 40 to move the nozzle 44 from the outside of the substrate W to the center side of the substrate W beyond the edge of the substrate in the state that the substrate W is still rotated at the rotation number ω2 and the rinse liquid L2 is still discharged from the nozzle 44 (see FIG. 25D and FIG. 27). In addition, the rotation number of the substrate W at the time when the supply of the rinse liquid L2 onto the substrate W is begun may be a value smaller than the rotation number ω1, for example, about 600 rpm to about 2400 rpm.

In the supply of the rinse liquid L2, the rinse liquid L2 may be supplied to the substrate W under the following processing conditions (see FIG. 27).

Liquid landing point of the rinse liquid L2: about 1.5 mm from the edge of the substrate W Supply time of the rinse liquid L2: about 10 seconds Discharge flow rate of the rinse liquid L2: about 15 ml/min Next, the controller Ctr controls the rotating/holding device 20 and the rinse liquid supply 40 to change the rotation number of the substrate W to the rotation number ω1 in the state that the rinse liquid L2 is supplied on the peripheral portion We of the substrate W (see FIG. 25E and FIG. 27). The rotation number of the substrate W may be changed after the rinse liquid L2 discharged from the nozzle 44 reaches the aforementioned liquid landing point. The timing when the rotation number of the substrate W is changed may be, for example, about 1 second or about 1 second to 5 seconds after the start of supply of the rinse liquid L2. In addition, the changed rotation number of the substrate W may be larger than the rotation number ω2, for example, about 600 rpm to about 2400 rpm.

Next, the controller Ctr controls the rotating/holding device 20 to carry on the rotation of the substrate W. Accordingly, the rinse liquid L2 is scattered off the substrate W, so that substrate W is dried (see FIG. 25F and FIG. 27). Through these processes, the processing of the substrate W is completed.

In the drying processing, the substrate W may be dried under the following processing conditions (see FIG. 27).

Rotation number of the substrate W: about 2500 rpm

Drying time of substrate W: about 5 seconds

According to the example of FIG. 25A to FIG. 27, while the supply of the etching liquid L1 onto the peripheral portion We of the substrate W is continued, the rotation number of the substrate W is reduced from the rotation number ω1 to the rotation number ω2. With the change of the rotation number of the substrate W, the centrifugal force acting on the etching liquid L1 decreases, and the interface (gas-liquid interface) between the etching liquid L1 and the atmosphere is moved to the center side of the substrate W (see FIG. 26B). Accordingly, by the etching liquid L1 moved to the center side, the etching residues RE collected at the gas-liquid interface in the etching processing are removed, and, further, the etching residues RE collected at the gas-liquid interface in the etching processing are suppressed from being dried and solidified. Accordingly, it becomes possible to effectively remove the etching residues RE by supplying the rinse liquid L2 to the peripheral portion We of the substrate W afterwards. In addition, according to the example of FIG. 25A to FIG. 27, since it is sufficient to change the rotation number of the substrate W, it is not necessary to change the process of supplying the etching liquid L1 or the rinse liquid L2. Therefore, the processing of the substrate W can be carried out efficiently. Furthermore, according to the example of FIG. 25A to FIG. 27, the rinse liquid L2 starts to be supplied to the substrate W in the state that the rotation number of the substrate W is smaller than the rotation number ω1. That is, the supply of the rinse liquid L2 onto the substrate W is started in the state that the interface (gas-liquid interface) between the etching liquid L1 and the atmosphere is maintained at the center side of the substrate W. Therefore, the etching residues RE are suppressed from being dried and solidified between the end of the supply of the etching liquid L1 and the start of the supply of the rinse liquid L2. Accordingly, the etching residues RE can be removed more effectively.

Figure 28:
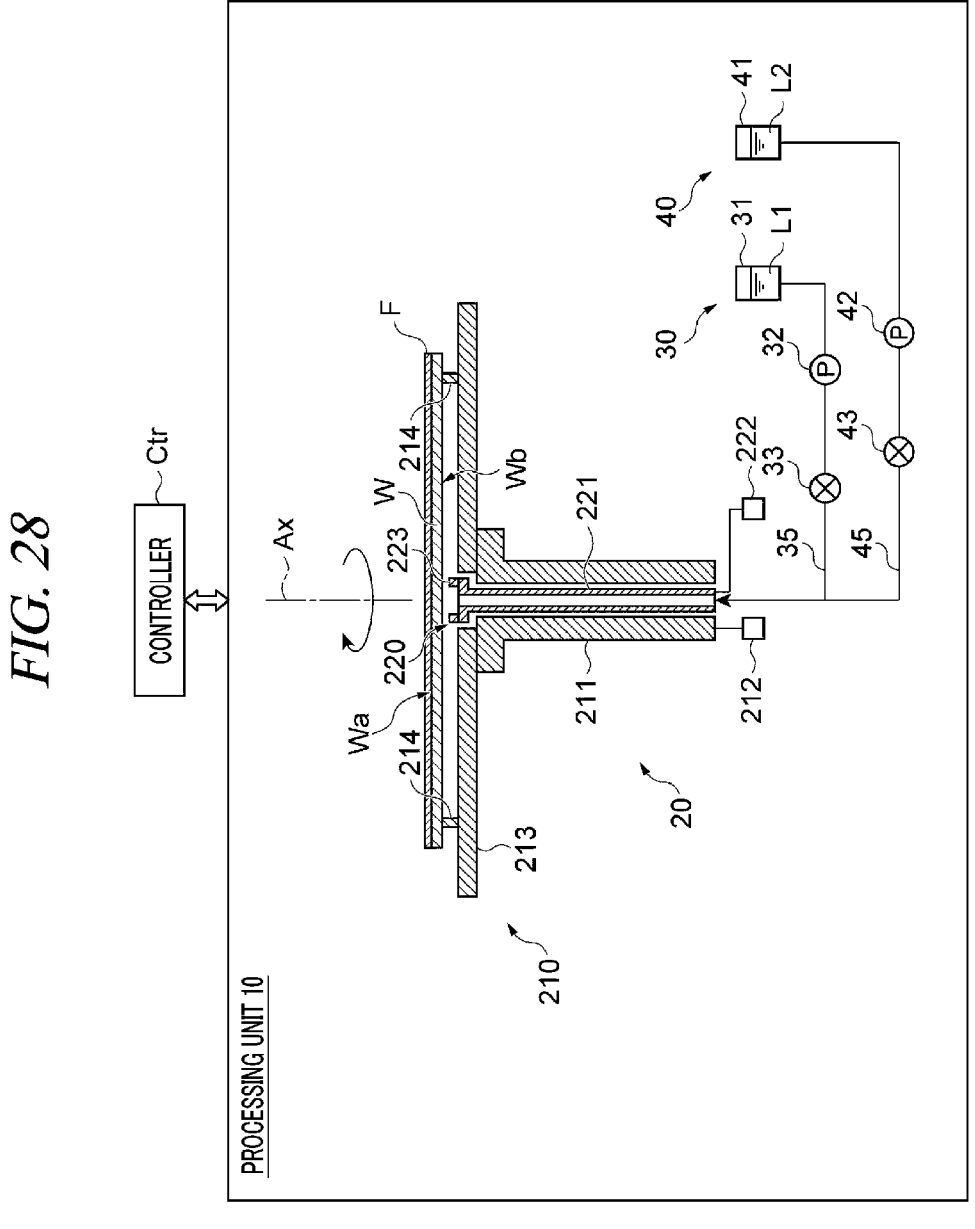
FIG. 28 is a side view schematically illustrating yet another example of the processing unit.

(10) The etching liquid L1 and the rinse liquid L2 may be supplied to the rear surface Wb of the substrate W. Since the processing unit 10 illustrated in FIG. 28 supplies the etching liquid L1 and the rinse liquid L2 to the rear surface Wb of the substrate W, it is different from the processing unit 10 shown in FIG. 3 in the configuration of the rotating/holding device 20, the chemical liquid supply 30 and the rinse liquid supply 40. The following description will mainly focus on these distinctive features. Further, in FIG. 28, illustration of the heating device 50 and the imaging device 60 is omitted.

The rotating/holding device 20 includes a rotator 210 and a lifter 220. The rotator 210 includes a rotation shaft 211, a driving mechanism 212, a supporting plate 213, and a plurality of supporting pins 214. The rotation shaft 211 is a hollow tubular member extending along a vertical direction. The rotation shaft 211 is configured to be pivotable about a central axis Ax.

The driving mechanism 212 is connected to the rotation shaft 211. The driving mechanism 212 is operated based on an operation signal from the controller Ctr, and is configured to rotate the rotation shaft 211. The driving mechanism 212 may be, for example, a power source such as an electric motor.

The supporting plate 213 is, for example, a flat plate having an annular shape, and it extends horizontally. That is, a through hole is formed in a central portion of the supporting plate 213. An inner periphery of the supporting plate 213 is connected to a leading end of the rotation shaft 211. Accordingly, the supporting plate 213 is configured to be rotated about the central axis Ax along with the rotation shaft 211.

The plurality of supporting pins 214 are provided on the supporting plate 213, protruding upwards from a top surface of the supporting plate 213. These supporting pins 214 are configured such that leading ends thereof come into contact with the rear surface Wb of the substrate W, thus supporting the substrate W in a substantially horizontal manner.

The lifter 220 includes a shaft member 221, a driving mechanism 222, and a plurality of supporting pins 223. The shaft member 221 is a hollow tubular member extending along the vertical direction. The shaft member 221 is configured to be movable up and down in the vertical direction. The shaft member 221 is inserted through the inside of the rotation shaft 211.

The driving mechanism 222 is connected to the shaft member 221. The driving mechanism 222 is operated based on an operation signal from the controller Ctr, and is configured to move the shaft member 221 up and down. As the driving mechanism 222 moves the shaft member 221 up and down, the shaft member 221 may be moved between a raised position where the plurality of supporting pins 223 are located above the plurality of supporting pins 214 and a lowered position where the plurality of supporting pins 223 are located below the plurality of supporting pins 214. The driving mechanism 222 may be, for example, a power source such as a linear actuator.

The plurality of supporting pins 223 are provided on the shaft member 221, protruding upwards from an upper end of the shaft member 221. These supporting pins 223 are configured such that leading ends thereof come into contact with the rear surface Wb of the substrate W, thus supporting the substrate W.

The chemical liquid supply 30 in the example of FIG. 28 does not include the nozzle 34. Instead, the downstream end of the pipeline 35 is fluidly connected to the shaft member 221. Accordingly, the chemical liquid supply 30 is configured to supply the etching liquid L1 of the liquid source 31 to the rear surface Wb of the substrate W through the inside of the shaft member 221.

Likewise, the rinse liquid supply 40 in the example of FIG. 28 does not include the nozzle 44. Instead, the downstream end of the pipeline 45 is fluidly connected to the shaft member 221. Accordingly, the rinse liquid supply 40 is configured to supply the rinse liquid L2 of the liquid source 41 to the rear surface Wb of the substrate W through the inside of the shaft member 221.

Now, referring to FIG. 28, FIG. 29A and FIG. 29B, a method of etching the metal polycrystalline film F formed on the substrate W by using the processing unit 10 illustrated in FIG. 28 will be described.

First, the controller Ctr controls the transfer arms A1 and A2 to take out one substrate W from the carrier 7 and transfer it into any one of the processing units 10. At this time, the controller Ctr controls the driving mechanism 222 to place the shaft member 221 at the raised position. The substrate W carried into the processing unit 10 is delivered from the transfer arm A2 onto the supporting pins 223. Thus, the substrate W is placed on the supporting pins 223 (lifter 220) such that the rear surface Wb is in contact with the supporting pins 223.

Subsequently, the controller Ctr controls the driving mechanism 222 to lower the shaft member 221 to the lowered position. While the shaft member 221 is being lowered, the substrate W is delivered from the supporting pins 223 onto the supporting pins 214. Accordingly, the substrate W is placed on the supporting pins 214 (rotator 210) such that the rear surface Wb is in contact with the supporting pins 214.

Next, the controller Ctr controls the driving mechanism 212 to rotate the substrate W together with the rotator 210. The rotation number of the substrate W may be, e.g., about 100 rpm to about 3000 rpm. In this state, the controller Ctr controls the chemical liquid supply 30 to supply the etching liquid L1 to the rear surface Wb of the substrate W from the shaft member 221 for a predetermined time (process X1: FIG. 29A). The supply time of the etching liquid L1 to the rear surface Wb of the substrate W may be in the range from 10 seconds to about 180 seconds. As illustrated in FIG. 29A, the etching liquid L1 supplied to the rear surface Wb of the substrate W flows along the rear surface Wb toward the edge of the substrate W due to a centrifugal force, and then flows along the edge of the substrate W and is supplied to the peripheral portion Wc of the front surface Wa of the substrate W. Then, the etching liquid L1 is scattered off. Accordingly, the liquid film of the etching liquid L1 is formed on the peripheral portion Wc while the supply of the etching liquid L1 from the shaft member 221 is being carried on. As a result, a portion of the metal polycrystalline film F located at the peripheral portion Wc is etched.

Next, the controller Ctr controls the rinse liquid supply 40 to supply the rinse liquid L2 from the shaft member 221 to the rear surface Wb of the substrate W for a preset time (process X2: FIG. 29B). The supply time of the rinse liquid L2 to the rear surface Wb of the substrate W may be in the range from about 10 seconds to 180 seconds. As illustrated in FIG. 29B, the rinse liquid L2 supplied to the rear surface Wb of the substrate W flows along the rear surface Wb toward the edge of the substrate W due to the centrifugal force, and then flows along the edge of the substrate W and is supplied to the peripheral portion Wc of the front surface Wa of the substrate W. Then, the rinse liquid L2 is scattered off. Accordingly, the liquid film of the rinse liquid L2 is formed on the peripheral portion Wc while the supply of the rinse liquid L2 from the shaft member 221 is being carried on. As a result, the etching residues RE generated in the supply of the etching liquid L1 is washed away by the rinse liquid L2.

Then, the processes X1 and X2 (the supply of etching liquid L1 and the rinse liquid L2) are repeated one or more times. The repetition number may be about 1 to 20 times. Then, the controller Ctr controls the chemical liquid supply 30 and the rinse liquid supply 40 to stop the supply of the etching liquid L1 and the rinse liquid L2. Then, the controller Ctr controls the rotator 210 to keep on rotating the substrate W. Accordingly, the rinse liquid L2 is scattered off the substrate W, and the substrate W is dried. Through the above-described processes, the processing of the substrate W is completed.

Figure 29A:
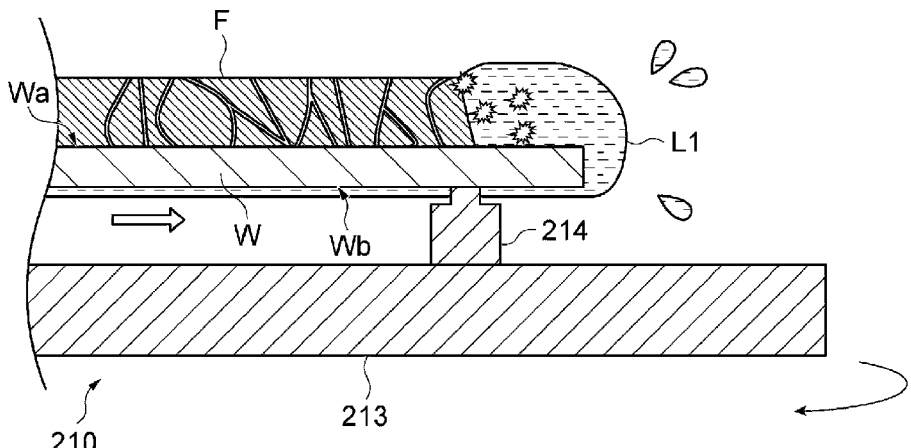
FIG. 29A and FIG. 29B are cross sectional views illustrating yet another example of the substrate processing sequence.
Figure 29B:
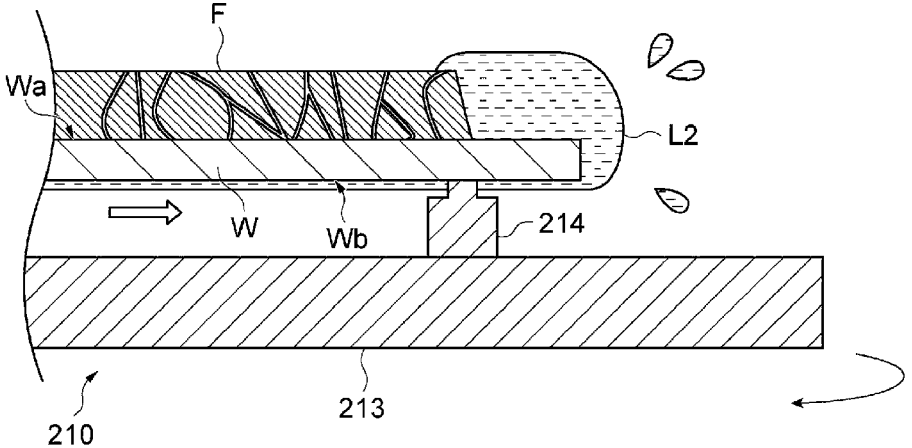

According to the example of FIG. 28, FIG. 29A and FIG. 29B, the etching processing at the peripheral portion Wc of the substrate W is not performed all at once but is performed over several times. Accordingly, before the etching residues RE generated in the etching processing are dried and solidified, the etching residues RE are removed by the rinse liquid L2. As a result, the etching residues RE can be effectively removed.

[Other Examples]

Example 1. An example of a substrate processing method includes a first process of partially etching a metal polycrystalline film at a peripheral portion of a substrate in a thickness direction by supplying an etching liquid to the peripheral portion while rotating the substrate having the metal polycrystalline film formed on a front surface thereof; a second process of washing away an etching residue generated in the first process with a rinse liquid by supplying the rinse liquid to a portion of the substrate closer to a center side of the substrate than a supply position of the etching liquid in the first process while rotating the substrate; a third process of etching a remaining portion of the metal polycrystalline film at the peripheral portion of the substrate by supplying the etching liquid to the peripheral portion while rotating the substrate; a fourth process of washing away an etching residue generated in the third process with the rinse liquid by supplying the rinse liquid to a portion of the substrate closer to the center side of the substrate than a supply position of the etching liquid in the third process while rotating the substrate; and a fifth process of drying the substrate after the fourth process.

Here, the metal polycrystalline film (for example, titanium nitride, tungsten, etc.) is composed of polycrystals in which a large number of crystal grains are aggregated. The interface between these crystal grains is called the crystal grain boundary (simply referred to as the grain boundary), which is the discontinuous surface in which the directions of the crystal grains are different. For this reason, when the etching liquid is supplied to the metal polycrystalline film, the etching liquid permeates the grain boundary before the metal polycrystalline film is dissolved, and the metal polycrystalline film is partially peeled off at the grain boundary. Accordingly, a part of the peeled metal polycrystalline film remains insoluble in the etching liquid, resulting in the generation of the etching residue. Although the etching residue is mostly removed from the substrate by being carried with the etching liquid supplied to the substrate, a part thereof may collect at the interface (gas-liquid interface) between the etching liquid and the atmosphere. This is because liquid retention occurs at the liquid landing point of the etching liquid supplied to the substrate, or the etching liquid supplied to the substrate flows not only to the peripheral side but also to the center side of the substrate to some extent. In the substrate processing, the substrate is being rotated and is sometimes heated to accelerate the etching. Accordingly, if the etching residue is dried and solidified, they may not be removed from the substrate even if the rinse liquid is supplied to the substrate later.

However, in Example 1, the rinse liquid is supplied during the etching of the metal polycrystalline film. For this reason, the etching residue generated during the etching of the metal polycrystalline film is once washed away by the rinse liquid before it is dried and solidified. Accordingly, when etching the metal polycrystalline film formed on the front surface of the substrate, it becomes possible to effectively remove the etching residue.

Example 2. In the method of Example 1, the second process may include starting the supplying of the rinse liquid during the supplying of the etching liquid in the first process. In this case, since the supply of the liquid to the substrate is continued, the etching residue is difficult to dry and solidify. Therefore, it becomes possible to remove the etching residue more effectively.

Example 3. In the method of Example 1 or Example 2, the fourth process may include starting the supplying of the rinse liquid during the supplying of the etching liquid in the third process. In this case, the same effect as obtained in Example 2 is achieved.

Example 4. In the method of Example 2 or Example 3, the second process and the fourth process may include, while discharging the rinse liquid from a nozzle, moving the nozzle from an outside of the substrate toward the center side of the substrate beyond an edge of the substrate and increasing a flow rate of the rinse liquid discharged from the nozzle after the nozzle crosses the edge of the substrate. In this case, the flow rate of the rinse liquid from the nozzle when the nozzle is crossing the edge of the substrate is relatively small. Thus, even if the rinse liquid discharged from the nozzle collides with the liquid film of the etching liquid previously supplied on the substrate, the splashing of the etching liquid is less likely to occur. Accordingly, the contamination of the substrate that is caused by the diffusion of the etching liquid into the atmosphere can be suppressed. Meanwhile, once the rinse liquid is supplied to the substrate, the flow rate of the rinse liquid from the nozzle is set to be relatively large. Thus, the etching residue can be effectively washed away from the substrate.

Example 5. In the method of any one of Example 2 to Example 4, when a discharge angle of the rinse liquid from the nozzle is defined as an angle of a flow line of the rinse liquid connecting a liquid landing point of the rinse liquid discharged from the nozzle on the substrate and a discharge opening of the nozzle with respect to a reference line connecting the liquid landing point and a center of the substrate when viewed from a top, the second process or the fourth process may include, while discharging the rinse liquid from the nozzle, moving the nozzle from the outside of the substrate toward the center side of the substrate beyond the edge of the substrate and increasing the discharge angle after the nozzle crosses the edge of the substrate. In this case, the discharge angle of the rinse liquid when the nozzle is crossing the edge of the substrate is relatively small. That is, the rinse liquid discharged from the nozzle tends to head toward the outside of the substrate in a diametrical direction of the substrate. Thus, even if the splashing of the etching liquid occurs when the rinse liquid discharged from the nozzle collides with the liquid film of the etching liquid previously supplied on the substrate, the etching liquid is likely to be diffused toward the outside of the substrate. Therefore, since the diffused etching liquid becomes difficult to attach to the substrate, it becomes possible to suppress the contamination of the substrate. Meanwhile, once the rinse liquid is supplied to the substrate, the discharge angle is set to be relatively large. That is, when viewed from the liquid landing point as the reference, the direction of the flow line of the rinse liquid approaches the direction of the tangent line of the substrate. Accordingly, the rinse liquid supplied on the substrate flows on the peripheral portion of the substrate over a wider range. Thus, it becomes possible to effectively wash away the etching residue from the substrate.

Example 6. The method of any one of Example 1 to Example 5 may further include a sixth process of heating the substrate in the first process to the fourth process. The sixth process may include heating the substrate such that a temperature of the substrate before and after the start of the supplying of the rinse liquid in the fourth process becomes lower than the temperature of the substrate during the supplying of the etching liquid in the first process and the third process. In this case, since the temperature of the substrate becomes relatively low before and after the start of the supplying of the rinse liquid, the drying and the solidification of the etching residue are suppressed. Meanwhile, since the temperature of the substrate becomes relatively high in a period other than before and after the start of the supplying of the rinse liquid, the etching of the metal polycrystalline film is accelerated. Thus, it becomes possible to achieve both speed-up of the etching processing and effective removal of the etching residue.

Example 7. The method of Example 1 to Example 6 may further include a seventh process of imaging the peripheral portion with an imaging device during the supplying of the etching liquid onto the substrate; and an eighth process of determining whether or not the etching residue is generated at the peripheral portion based on a change in contrast of an image captured by the imaging device. In this case, it becomes possible to automatically detect presence or absence of the etching residue by the image processing.

Example 8. In the method of Example 7, when it is determined in the eighth process that the etching residue is generated, the second process or the fourth process of washing away the etching residue with the rinse liquid by supplying the rinse liquid onto the substrate may be performed. Depending on the etching conditions (for example, the material of the metal polycrystalline film, the type of the etching liquid, etc.), the timing when the etching residue is generated may be different. For this reason, if this timing is found through the previous test or the like and the supply timing of the rinse liquid is appropriately set based on the etching conditions, the etching residue can be removed more efficiently. In Example 8, however, if the etching residue is generated, this etching residue is automatically washed away by the rinse liquid. Therefore, the previous test or the like can be omitted, so that the efficiency of the substrate processing can be improved.

Example 9. Another example of a substrate processing method includes a first process of etching a metal polycrystalline film at a peripheral portion of a substrate by moving a nozzle at a first speed from an outside of the substrate to a center side of the substrate beyond an edge of the substrate while rotating the substrate having the metal polycrystalline film formed on a front surface thereof and discharging an etching liquid from the nozzle; a second process of etching the metal polycrystalline film at the peripheral portion of the substrate by moving the nozzle having passed the edge of the substrate to a preset position on the center side of the substrate at a second speed lower than the first speed while rotating the substrate and discharging the etching liquid from the nozzle; a third process of washing away an etching residue generated in the second process with a rinse liquid by supplying the rinse liquid to a portion of the substrate closer to the center side of the substrate than a supply position of the etching liquid in the second process while rotating the substrate; and a fourth process of drying the substrate after the third process. In Example 9, the nozzle which is discharging the etching liquid is moved at a relatively low speed until it reaches the preset position from an intermediate position. For this reason, at the moment when the nozzle reaches the preset position and is stopped thereat, the inertial force acting on the etching liquid discharged from the nozzle is reduced, so that it becomes difficult for the etching liquid to flow to the center side of the substrate. Accordingly, since the diffusion of the etching liquid to the center side of the substrate is suppressed, it becomes difficult for the etching liquid to stay at the gas-liquid interface. As a result, the etching residue becomes difficult to dry and solidify, so that the etching residue can be effectively removed when the rinse liquid is supplied later. Meanwhile, in Example 9, the nozzle which is discharging the etching liquid is moved at a comparatively high speed up to the intermediate position. Accordingly, the total processing time of the etching is shortened. Thus, the efficiency of the substrate processing can be improved.

Example 10. Yet another example of a substrate processing method includes a first process of etching a metal polycrystalline film at a first position of a peripheral portion of a substrate by supplying an etching liquid to the first position while rotating the substrate having the metal polycrystalline film formed on a front surface thereof; a second process of etching the metal polycrystalline film at a second position of the peripheral portion closer to a center side of the substrate than the first position by supplying the etching liquid to the second position while rotating the substrate; a third process of washing away an etching residue generated in the second process with a rinse liquid by supplying the rinse liquid to a portion of the substrate closer to the center side of the substrate than the second position while rotating the substrate; and a fourth process of drying the substrate after the third process.

The etching rate of the metal polycrystalline film by the etching liquid is the highest at the liquid landing point of the etching liquid. For this reason, if the etching processing is performed without changing the position of the nozzle which discharges the etching liquid, the etching of the portion of the metal polycrystalline film corresponding to the liquid landing point is completed relatively quickly, whereas it takes a relatively long time until the portion of the metal polycrystalline film closer to the edge of the substrate than the liquid landing point is completely etched. In this case, the etching residue becomes easy to dry and solidify at the gas-liquid interface.

In Example 10, however, the etching liquid is first supplied to the first position of the peripheral portion of the substrate, and then, is supplied to the second position of the peripheral portion which is closer to the center of the substrate than the first position. For this reason, when etching the metal polycrystalline film at the second position, the metal polycrystalline film on the peripheral side with respect to the first position is already etched. Accordingly, the etching processing at the second position is completed in a relatively short time. As a result, since the etching residue becomes difficult to dry and solidify, it becomes possible to remove the etching residue effectively when the rinse liquid is supplied afterwards. Further, in Example 10, the total processing time of the etching is shortened. Accordingly, the efficiency of the substrate processing can be improved.

Example 11. Still another example of a substrate processing method includes a first process of etching a metal polycrystalline film at a peripheral portion of a substrate by supplying an etching liquid to the peripheral portion while rotating the substrate having the metal polycrystalline film formed on a front surface thereof at a first rotation number; a second process of changing a rotation number of the substrate to a second rotation number smaller than the first rotation number while keeping on supplying the etching liquid to the peripheral portion of the substrate; a third process of washing away an etching residue generated in the first process and the second process with a rinse liquid by supplying the rinse liquid to a portion of the substrate closer to a center side of the substrate than a supply position of the etching liquid in the first process and the second process while rotating the substrate; and a fourth process of drying the substrate after the third process. In Example 11, after the metal polycrystalline film at the peripheral portion of the substrate being rotated at the first rotation number is etched, the rotation number of the substrate is changed to the second rotation number smaller than the first rotation number while the supplying of the etching liquid to the peripheral portion is being carried on. For this reason, the centrifugal force acting on the etching liquid decreases, and the interface (gas-liquid interface) between the etching liquid and the atmosphere is moved to the center side of the substrate. Accordingly, by the etching liquid moved to the center side, the etching residue collected at the gas-liquid interface in the first process is removed, and, further, the etching residue collected at the gas-liquid interface in the first process is suppressed from being dried and solidified. Accordingly, it becomes possible to effectively remove the etching residue by supplying the rinse liquid to the peripheral portion of the substrate afterwards. In addition, in Example 11, since it is sufficient to change the rotation number of the substrate, it is not necessary to change the process of supplying the etching liquid or the rinse liquid. Thus, the processing of the substrate can be carried out efficiently.

Example 12. Still yet another example of a substrate processing method includes a first process of etching a metal polycrystalline film at a peripheral portion of a substrate with an etching liquid flown to the peripheral portion from a rear surface of the substrate by supplying the etching liquid to the rear surface while rotating the substrate having the metal polycrystalline film formed on a front surface thereof; a second process of washing away an etching residue generated in the first process with a rinse liquid flown to the peripheral portion from the rear surface of the substrate by supplying the rinse liquid to the rear surface while rotating the substrate after the first process; a third process of repeating, after the second process, the first process and the second process one or more times; and a fourth process of drying the substrate after the third process. In this case, the etching processing at the peripheral portion of the substrate is not performed all at once but is performed over several times. Thus, before the etching residue generated in the etching processing is dried and solidified, the etching residue is removed by the rinse liquid. As a result, it becomes possible to effectively remove the etching residue.

Example 13. An example of a substrate processing apparatus includes a rotating/holding device configured to hold and rotate a substrate having a metal polycrystalline film formed on a front surface thereof; a chemical liquid supply configured to supply an etching liquid to the front surface of the substrate; a rinse liquid supply configured to supply a rinse liquid to the front surface of the substrate; and a controller. The controller is configured to perform a first processing of partially etching the metal polycrystalline film at a peripheral portion of the substrate in a thickness direction by controlling the chemical liquid supply to supply the etching liquid to the peripheral portion while controlling the rotating/holding device to hold and rotate the substrate. The controller is also configured to perform a second processing of washing away an etching residue generated in the first processing with a rinse liquid by controlling the rinse liquid supply to supply the rinse liquid to a portion of the substrate closer to a center side of the substrate than a supply position of the etching liquid in the first processing while controlling the rotating/holding device to hold and rotate the substrate. The controller is also configured to perform a third processing of etching a remaining portion of the metal polycrystalline film at the peripheral portion of the substrate by controlling the chemical liquid supply to supply the etching liquid to the peripheral portion while controlling the rotating/holding device to hold and rotate the substrate. The controller is also configured to perform a fourth processing of washing away an etching residue generated in the third processing by controlling the rinse liquid supply to supply the rinse liquid to a portion of the substrate closer to the center side of the substrate than a supply position of the etching liquid in the third processing while controlling the rotating/holding device to hold and rotate the substrate. The controller is also configured to perform a fifth processing of drying the substrate by controlling the rotating/holding device to hold and rotate the substrate. In this case, the same effect as obtained in the method of Example 1 may be achieved.

Example 14. In the apparatus of Example 13, the second processing may include starting the supply of the rinse liquid during the supply of the etching liquid in the first processing. In this case, the same effect as obtained in the method of Example 2 may be achieved.

Example 15. In the apparatus of Example 13 or Example 14, the fourth processing may include starting the supply of the rinse liquid during the supply of the etching liquid in the third processing. In this case, the same effect as obtained in the method of Example 3 may be achieved.

Example 16. In the apparatus of Example 14 or Example 15, the second processing or the fourth processing may include, while discharging the rinse liquid from a nozzle of the rinse liquid supply, moving the nozzle from an outside of the substrate toward the center side of the substrate beyond an edge of the substrate and increasing a flow rate of the rinse liquid discharged from the nozzle after the nozzle crosses the edge of the substrate. In this case, the same effect as obtained in the method of Example 4 may be achieved.

Example 17. In the apparatus of any one of Example 14 to Example 16, when a discharge angle of the rinse liquid from the nozzle of the rinse liquid supply is defined as an angle of a flow line of the rinse liquid connecting a liquid landing point of the rinse liquid discharged from the nozzle on the substrate and a discharge opening of the nozzle with respect to a reference line connecting the liquid landing point and a center of the substrate when viewed from a top, the second processing or the fourth processing may include, while discharging the rinse liquid from the nozzle, moving the nozzle from the outside of the substrate toward the center side of the substrate beyond the edge of the substrate and increasing the discharge angle after the nozzle crosses the edge of the substrate. In this case, the same effect as obtained in the method of Example 5 may be achieved.

Example 18. The apparatus of any one of Example 13 to Example 17 may further include a heating device configured to heat the substrate. The controller may be configured to perform a sixth processing of heating the substrate in the first processing to the fourth processing. The sixth processing may include heating the substrate by the heating device such that a temperature of the substrate before and after the start of the supplying of the rinse liquid in the fourth processing becomes lower than the temperature of the substrate during the supplying of the etching liquid in the first processing and the third processing. In this case, the same effect as obtained in the method of Example 6 may be achieved.

Example 19. The apparatus of any one of Example 13 to Example 18 may further include an imaging device configured to image the peripheral portion. The controller may be configured to perform a seventh processing of imaging the peripheral portion by controlling the imaging device during the supplying of the etching liquid onto the substrate; and an eighth processing of determining whether or not the etching residue is generated at the peripheral portion based on a change in contrast of an image captured by the imaging device. In this case, the same effect as obtained in the method of Example 7 may be achieved.

Example 20. In the apparatus of Example 19, when it is determined in the eighth processing that the etching residue is generated, the controller may perform the second processing or the fourth processing of washing away the etching residue with the rinse liquid by supplying the rinse liquid onto the substrate. In this case, the same effect as obtained in the method of Example 8 may be achieved.

Example 21. Another example of a substrate processing apparatus includes a rotating/holding device configured to hold and rotate a substrate having a metal polycrystalline film formed on a front surface thereof; a chemical liquid supply configured to supply an etching liquid to the front surface of the substrate; a rinse liquid supply configured to supply a rinse liquid to the front surface of the substrate; and a controller. The controller is configured to perform a first processing of etching the metal polycrystalline film at a peripheral portion of the substrate by controlling the rotating/holding device to hold and rotate the substrate, and also controlling the chemical liquid supply to move a nozzle at a first speed from an outside of the substrate to a center side of the substrate beyond an edge of the substrate while discharging the etching liquid from the nozzle of the chemical liquid supply. The controller is also configured to perform a second processing of etching the metal polycrystalline film at the peripheral portion of the substrate by controlling the rotating/holding device to hold and rotate the substrate, and also controlling the chemical liquid supply to move the nozzle having passed the edge of the substrate to a preset position on the center side of the substrate at a second speed lower than the first speed while discharging the etching liquid from the nozzle. The controller is also configured to perform a third processing of washing away an etching residue generated in the second processing with the rinse liquid by controlling the rotating/holding device to hold and rotate the substrate, and also controlling the rinse liquid supply to supply the rinse liquid to a position closer to the center side of the substrate than a supply position of the etching liquid in the second processing. The controller is also configured to perform a fourth processing of drying the substrate by controlling the rotating/holding device to hold and rotate the substrate. In this case, the same effect as obtained in the method of Example 9 may be achieved.

Example 22. Yet another example of a substrate processing apparatus includes a rotating/holding device configured to hold and rotate a substrate having a metal polycrystalline film formed on a front surface thereof; a chemical liquid supply configured to supply an etching liquid to the front surface of the substrate; a rinse liquid supply configured to supply a rinse liquid to the front surface of the substrate; and a controller. The controller is configured to perform a first processing of etching the metal polycrystalline film at a first position of a peripheral portion of the substrate by controlling the chemical liquid supply to supply the etching liquid to the first position while controlling the rotating/holding device to hold and rotate the substrate. The controller is also configured to perform a second processing of etching the metal polycrystalline film at a second position of the peripheral portion closer to a center side of the substrate than the first position by controlling the chemical liquid supply to supply the etching liquid to the second position while controlling the rotating/holding device to hold and rotate the substrate. The controller is also configured to perform a third processing of washing away an etching residue generated in the second processing with the rinse liquid by controlling the rinse liquid supply to supply the rinse liquid to a position closer to the center side of the substrate than the second position while controlling the rotating/holding device to hold and rotate the substrate. The controller is also configured to perform a fourth processing of drying the substrate by controlling the rotating/holding device to hold and rotate the substrate. In this case, the same effect as obtained in the method of Example 10 may be achieved.

Example 23. Still another example of a substrate processing apparatus includes a rotating/holding device configured to hold and rotate a substrate having a metal polycrystalline film formed on a front surface thereof; a chemical liquid supply configured to supply an etching liquid to the front surface of the substrate; a rinse liquid supply configured to supply a rinse liquid to the front surface of the substrate; and a controller. The controller is configured to perform a first processing of etching the metal polycrystalline film at a peripheral portion of the substrate by controlling the chemical liquid supply to supply the etching liquid to the peripheral portion while controlling the rotating/holding device to rotate the substrate at a first rotation number. The controller is also configured to perform a second processing of controlling the rotating/holding device to change a rotation number of the substrate to a second rotation number smaller than the first rotation number while controlling the chemical liquid supply to keep on supplying the etching liquid to the peripheral portion of the substrate. The controller is also configured to perform a third processing of washing away an etching residue generated in the first processing and the second processing by controlling the rinse liquid supply to supply the rinse liquid to a position closer to a center side of the substrate than a supply position of the etching liquid in the first processing and the second processing while controlling the rotating/holding device to hold and rotate the substrate. The controller is also configured to perform a fourth processing of drying the substrate by controlling the rotating/holding device to hold and rotate the substrate. In this case, the same effect as obtained in the method of Example 11 may be achieved.

Example 24. Still yet another example of a substrate processing apparatus includes a rotating/holding device configured to hold and rotate a substrate having a metal polycrystalline film formed on a front surface thereof; a chemical liquid supply configured to supply an etching liquid to a rear surface of the substrate; a rinse liquid supply configured to supply a rinse liquid to the rear surface of the substrate; and a controller. The controller is configured to perform a first processing of etching the metal polycrystalline film at a peripheral portion of the substrate with the etching liquid flown to the peripheral portion of the substrate from the rear surface by controlling the chemical liquid supply to supply the etching liquid to the rear surface while controlling the rotating/holding device to hold and rotate the substrate. The controller is also configured to perform, after the first processing, a second processing of washing away an etching residue generated in the first processing with the rinse liquid flown to the peripheral portion from the rear surface by controlling the rinse liquid supply to supply the rinse liquid to the rear surface while controlling the rotating/holding device to hold and rotate the substrate. The controller is also configured to perform, after the second processing, a third processing of repeating the first processing and the second processing one or more times. The controller is also configured to perform, after the third processing, a fourth processing of drying the substrate by controlling the rotating/holding device to hold and rotate the substrate. In this case, the same effect as obtained in the method of Example 12 may be achieved.

Example 25. As an example, a computer-readable recording medium may have stored thereon computer-executable instructions that, in response to execution, cause the substrate processing apparatus to perform the substrate processing method as described in any of Examples 1 to 11. In this case, the same effects as obtained in the method of Example 1 may be achieved. In the present specification, the computer-readable recording medium may be a non-transitory computer recording medium (for example, any of various types of main storage devices or auxiliary storage devices) or a transitory computer recording medium (for example, a data signal that can be provided via a network).

According to the substrate processing method and the substrate processing apparatus according to the exemplary embodiments, it is possible to remove the etching residues effectively when etching the metal polycrystalline film formed on the surface of the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A substrate processing method, comprising:

(a) etching a metal polycrystalline film at a peripheral portion of a substrate by moving a nozzle at a first speed from an outside of the substrate to a center side of the substrate beyond an edge of the substrate while rotating the substrate having the metal polycrystalline film formed on a front surface thereof and discharging an etching liquid from the nozzle;

(b) etching the metal polycrystalline film at the peripheral portion of the substrate by moving the nozzle having passed the edge of the substrate to a preset position on the center side of the substrate at a second speed lower than the first speed while rotating the substrate and discharging the etching liquid from the nozzle;

(c) washing away an etching residue generated in the etching of the metal polycrystalline film by moving the nozzle at the second speed with a rinse liquid by supplying the rinse liquid to a portion of the substrate closer to the center side of the substrate than a supply position of the etching liquid in the etching of the metal polycrystalline film by moving the nozzle at the second speed while rotating the substrate; and (d) drying the substrate after the washing away of the etching residue, wherein in (a) and (b), the substrate is rotated at the same rotational speed.

2. A substrate processing apparatus, comprising:

a rotating/holding device configured to hold and rotate a substrate having a metal polycrystalline film formed on a front surface thereof;

a chemical liquid supply configured to supply an etching liquid to the front surface of the substrate;

a rinse liquid supply configured to supply a rinse liquid to the front surface of the substrate; and a controller and a storage including a computer program, wherein the storage and the computer program are configured, with the controller, to perform:

a first processing of etching the metal polycrystalline film at a peripheral portion of the substrate by controlling the rotating/holding device to hold and rotate the substrate, and also controlling the chemical liquid supply to move a nozzle at a first speed from an outside of the substrate to a center side of the substrate beyond an edge of the substrate while discharging the etching liquid from the nozzle of the chemical liquid supply, a second processing of etching the metal polycrystalline film at the peripheral portion of the substrate by controlling the rotating/holding device to hold and rotate the substrate, and also controlling the chemical liquid supply to move the nozzle having passed the edge of the substrate to a preset position on the center side of the substrate at a second speed lower than the first speed while discharging the etching liquid from the nozzle, a third processing of washing away an etching residue generated in the second processing with the rinse liquid by controlling the rotating/holding device to hold and rotate the substrate, and also controlling the rinse liquid supply to supply the rinse liquid to a position closer to the center side of the substrate than a supply position of the etching liquid in the second processing, and a fourth processing of drying the substrate by controlling the rotating/holding device to hold and rotate the substrate, wherein in the first processing and the second processing, the substrate is rotated at the same rotational speed.

* * * * *